United States Patent
Sung et al.

(10) Patent No.: US 11,768,251 B2
(45) Date of Patent: Sep. 26, 2023

(54) BATTERY DIAGNOSIS APPARATUS, BATTERY DIAGNOSIS METHOD, BATTERY PACK, AND VEHICLE

(71) Applicant: LG Energy Solution, Ltd., Seoul (KR)

(72) Inventors: Yong-Chul Sung, Daejeon (KR); Yang-Soo An, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 18/132,524

(22) Filed: Apr. 10, 2023

(65) Prior Publication Data

US 2023/0243895 A1 Aug. 3, 2023

Related U.S. Application Data

(63) Continuation of application No. 17/918,774, filed as application No. PCT/KR2021/017684 on Nov. 26, 2021.

(30) Foreign Application Priority Data

Nov. 27, 2020 (KR) .................. 10-2020-0163366

(51) Int. Cl.
  *G01R 31/396* (2019.01)
  *G01R 31/392* (2019.01)
  (Continued)

(52) U.S. Cl.
  CPC .......... *G01R 31/396* (2019.01); *B60L 3/0046* (2013.01); *B60L 58/10* (2019.02);
  (Continued)

(58) Field of Classification Search
  CPC ............. G01R 31/396; G01R 31/392; G01R 31/3835; G01R 19/16542; G01R 31/3648;
  (Continued)

(56) References Cited

U.S. PATENT DOCUMENTS 6,023,539 A * 2/2000 Ohnami ............... G06K 13/063
                                                        358/468
6,222,348 B1 * 4/2001 Sato ................... H02J 7/00047
                                                        320/149
(Continued)

FOREIGN PATENT DOCUMENTS

JP  2001027663 A   1/2001
JP   5343299 B2   11/2013
(Continued)

OTHER PUBLICATIONS

International Search Report for Application No. PCT/KR2021/017684 dated Mar. 16, 2022, 2 pages.

*Primary Examiner* — Luis A Martinez Borrero
(74) *Attorney, Agent, or Firm* — Lerner David LLP

(57) ABSTRACT

A battery diagnosis apparatus for diagnosis of a cell group including a plurality of battery cells connected in series, includes a voltage sensing circuit configured to periodically generate a voltage signal indicating a cell voltage of each battery cell, and a control circuit configured to generate time series data indicating a change in cell voltage of each battery cell over time based on the voltage signal. The control circuit is configured to (i) determine a first average cell voltage and a second average cell voltage of each battery cell based on the time series data, wherein the first average cell voltage is a short term moving average, and the second average cell voltage is a long term moving average, and (ii) detect an abnormal voltage of each battery cell based on a difference between the first average cell voltage and the second average cell voltage.

20 Claims, 14 Drawing Sheets

(51) Int. Cl.
  *B60L 3/00*       (2019.01)
  *G01R 19/10*      (2006.01)
  *B60L 58/10*      (2019.01)
  *G01R 31/36*      (2020.01)
  *G01R 19/165*     (2006.01)
  *H01M 10/48*      (2006.01)
  *H01M 10/42*      (2006.01)
  *G01R 31/3835*    (2019.01)

(52) U.S. Cl.
  CPC ....... *G01R 19/10* (2013.01); *G01R 19/16542* (2013.01); *G01R 31/3648* (2013.01); *G01R 31/3835* (2019.01); *G01R 31/392* (2019.01); *H01M 10/425* (2013.01); *H01M 10/482* (2013.01); *H01M 2010/4271* (2013.01)

(58) Field of Classification Search
  CPC .... B60L 58/10; B60L 3/0046; H01M 10/425; H01M 10/482; H01M 2010/4271
  See application file for complete search history.

(56) References Cited

U.S. PATENT DOCUMENTS

| | | | |
|---|---|---|---|
| 6,472,875 B1 | 10/2002 | Meyer | |
| 7,432,719 B2* | 10/2008 | Nozaki | H02J 7/0047 |
| | | | 324/432 |
| 7,586,311 B2* | 9/2009 | Nozaki | B60L 3/0038 |
| | | | 324/432 |
| 8,285,501 B2* | 10/2012 | Kinoshita | G01R 31/3842 |
| | | | 702/63 |
| 9,297,858 B2* | 3/2016 | Lim | H02J 7/007182 |
| 9,341,681 B2* | 5/2016 | Kobayakawa | H02J 7/0047 |
| 10,436,847 B2* | 10/2019 | Iwane | G01R 31/378 |
| 10,921,378 B2* | 2/2021 | Chen | G01R 31/3835 |
| 11,346,886 B2* | 5/2022 | An | G01R 31/396 |
| 11,449,381 B2* | 9/2022 | Sung | G06F 11/0739 |
| 11,462,777 B2* | 10/2022 | Yonekura | H01M 10/4207 |
| 11,621,573 B2* | 4/2023 | Wang | H02J 7/005 |
| | | | 320/134 |
| 2007/0216366 A1* | 9/2007 | Inamine | H01M 6/14 |
| | | | 320/132 |
| 2007/0223259 A1* | 9/2007 | Nozaki | B60L 3/0038 |
| | | | 363/50 |
| 2008/0054908 A1* | 3/2008 | Suzuki | H01M 50/213 |
| | | | 324/426 |
| 2010/0211341 A1* | 8/2010 | Kinoshita | G01R 31/3842 |
| | | | 702/63 |
| 2015/0357852 A1* | 12/2015 | Nakao | H01M 10/48 |
| | | | 702/63 |
| 2016/0159242 A1 | 6/2016 | Hwang | |
| 2016/0169978 A1 | 6/2016 | Fukuhara | |
| 2016/0187431 A1* | 6/2016 | Yamamoto | H01M 10/425 |
| | | | 324/426 |
| 2018/0278066 A1* | 9/2018 | Kurahashi | B60L 3/04 |
| 2019/0131802 A1* | 5/2019 | Robbins | H02J 7/00032 |
| 2019/0257889 A1 | 8/2019 | Park | |
| 2020/0133757 A1* | 4/2020 | Sung | G06F 11/0739 |
| 2020/0161875 A1* | 5/2020 | Nishikawa | H02J 3/32 |
| 2020/0233037 A1 | 7/2020 | Yamamoto et al. | |
| 2020/0287251 A1* | 9/2020 | Yonekura | G01R 31/3842 |
| 2020/0355747 A1* | 11/2020 | An | G01R 19/0084 |
| 2021/0005938 A1* | 1/2021 | Hayashi | H01M 50/249 |
| 2021/0048482 A1* | 2/2021 | Ukumori | H01M 10/42 |
| 2021/0111568 A1* | 4/2021 | Cho | H01M 50/572 |
| 2021/0226462 A1* | 7/2021 | Seo | H02J 7/0047 |
| 2021/0231745 A1* | 7/2021 | Nagai | G01R 31/392 |
| 2021/0234386 A1* | 7/2021 | Purkayastha | H01M 10/48 |
| 2021/0265674 A1* | 8/2021 | Doczy | G01R 31/396 |
| 2021/0296911 A1* | 9/2021 | Itakura | G01R 31/3835 |
| 2021/0318386 A1* | 10/2021 | Itakura | H01M 10/48 |
| 2022/0077514 A1* | 3/2022 | Kim | H01M 10/425 |
| 2022/0140617 A1* | 5/2022 | Wang | G01R 31/396 |
| | | | 320/134 |
| 2022/0196752 A1* | 6/2022 | Lee | H01M 10/425 |
| 2022/0214405 A1* | 7/2022 | Kim | G01R 31/3842 |
| 2022/0229122 A1* | 7/2022 | Lee | G01R 31/396 |
| 2022/0314832 A1* | 10/2022 | An | H02J 7/00034 |
| 2023/0018662 A1* | 1/2023 | Roemersperger | B60L 58/22 |

FOREIGN PATENT DOCUMENTS

| | | |
|---|---|---|
| JP | 2014134467 A | 7/2014 |
| JP | 2017156268 A | 9/2017 |
| JP | 6285445 B2 | 2/2018 |
| JP | 6462214 B2 | 1/2019 |
| JP | 2019039825 A | 3/2019 |
| JP | 2020119712 A | 8/2020 |
| KR | 20100084935 A | 7/2010 |
| KR | 101619657 B1 | 5/2016 |
| KR | 20180101823 A | 9/2018 |

* cited by examiner

BATTERY DIAGNOSIS APPARATUS, BATTERY DIAGNOSIS METHOD, BATTERY PACK, AND VEHICLE

CROSS-REFERENCE TO RELATED APPLICATIONS

The present application is a continuation of U.S. patent application Ser. No. 17/918,774 filed Oct. 13, 2022, which application is a national phase entry under 35 U.S.C. § 371 of International Application No. PCT/KR2021/017684 filed Nov. 26, 2021, claims priority from Korean Patent Application No. 10-2020-0163366 filed on Nov. 27, 2020, all of which are incorporated herein by reference.

TECHNICAL FIELD

The present disclosure relates to technology for abnormal voltage diagnosis of a battery.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect and thus they are gaining more attention than nickel-based batteries for their advantages that recharging can be done whenever it is convenient, the self-discharge rate is very low and the energy density is high.

Recently, with the widespread of applications (for example, energy storage systems, electric vehicles) requiring high voltage, there is a rising need for accurate diagnosis of abnormal voltage of each of a plurality of battery cells connected in series in a battery pack.

Abnormal voltage conditions of a battery cell refers to faulty conditions caused by abnormal drop and/or rise of cell voltage due to an internal short circuit, an external short circuit, a defect in a voltage sensing line, bad connection with a charge/discharge line, and the like.

Attempts have been made to carry out abnormal voltage diagnosis of each battery cell by comparing a voltage across each battery cell, namely, a cell voltage, at a specific time with an average cell voltage of the plurality of battery cells at the same time as the specific time. However, the cell voltage of each battery cell relies on the temperature, current and/or State Of Health (SOH) of the corresponding battery cell, so it is difficult to achieve accurate diagnosis of abnormal voltage of each battery cell by simply comparing the cell voltages of the plurality of battery cells measured at the specific time. For example, when there is a large difference in temperature or SOH between a battery cell having no abnormal voltage and the remaining battery cells, a difference between the cell voltage of the corresponding battery cell and the average cell voltage may be also large.

To solve this problem, in addition to the cell voltage of each battery cell, additional parameters such as the charge/discharge current, the temperature of each battery cell and/or State Of Charge (SOC) of each battery cell may be used for abnormal voltage diagnosis of each battery cell. However, the diagnosis method using the additional parameters involves a process of detecting each parameter and a process of comparing the parameters, and thus requires more complexity and a longer time than diagnosis methods using the cell voltage as a single parameter.

SUMMARY

Technical Problem

The present disclosure is designed to solve the above-described problem, and therefore the present disclosure is directed to providing a battery diagnosis apparatus, a battery diagnosis method, a battery pack and a vehicle for efficient and accurate abnormal voltage diagnosis of a battery cell, in which an moving average of cell voltage of each of a plurality of battery cells is determined at each unit time for each of at least one moving window having a given time length, and abnormal voltage diagnosis of each battery cell is performed based on each moving average of each battery cell.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery diagnosis apparatus for achieving the above-described object is a battery diagnosis apparatus for a cell group including a plurality of battery cells connected in series, and may include a voltage sensing circuit configured to periodically generate a voltage signal indicating a cell voltage of each battery cell of the plurality of battery cells; and a control circuit configured to for each battery cell of the plurality of battery cells, generate time series data indicating a change in cell voltage of the battery cell over time based on the voltage signal.

Preferably, the control circuit may be configured to (i) for each battery cell of the plurality of battery cells, determine a first average cell voltage and a second average cell voltage of the battery cell based on the time series data, wherein the first average cell voltage is a short term moving average, and the second average cell voltage is a long term moving average, and (ii) detect an abnormal voltage of at least one battery cell based on a difference between the first average cell voltage and the second average cell voltage of the at least one battery cell.

In an aspect, the control circuit may be configured to for each battery cell of the plurality of battery cells, determine a short/long term average difference of the battery cell corresponding to the difference between the first average cell voltage and the second average cell voltage of the battery cell, for each battery cell of the plurality of battery cells, determine a cell diagnosis deviation of the battery cell corresponding to a deviation between an average value of short/long term average differences of all the plurality of battery cells and the short/long term average difference of the battery cell, and in response to the cell diagnosis deviation exceeding a diagnosis threshold for the at least one battery cell, determine that the at least one battery cell is an abnormal voltage cell.

Preferably, the control circuit may be configured to, for each battery cell of the plurality of battery cells, generate time series data of the cell diagnosis deviation of the battery cell, and determine that at least one battery cell of the plurality of battery cells is an abnormal voltage cell either (i) after a period of time during which the cell diagnosis deviation exceeds the diagnosis threshold or (ii) after a number of cell diagnosis deviations exceeding the diagnosis threshold exceeds a predetermined number.

In another aspect, the control circuit may be configured to for each battery cell of the plurality of battery cells, determine a short/long term average difference of the battery cell corresponding to the difference between the first average cell voltage and the second average cell voltage of the battery cell, for each battery cell of the plurality of battery cells, determine a cell diagnosis deviation of the battery cell corresponding to a deviation between an average value of short/long term average differences of all the plurality of battery cells and the short/long term average difference of the battery cell, determine a statistical adaptive threshold based on a standard deviation for the cell diagnosis deviation of all the plurality of battery cells, for each battery cell of the plurality of battery cells, generate time series data of a filter diagnosis value of the battery cell by filtering time series data for the cell diagnosis deviation of the battery cell based on the statistical adaptive threshold, and detect the abnormal voltage of the at least one battery cell based on a period of time during which the filter diagnosis value of the at least one battery cell exceeds a diagnosis threshold, or based on a number of the filter diagnosis value exceeding the diagnosis threshold.

In still another aspect, the control circuit may be configured to for each battery cell of the plurality of battery cells, determine a short/long term average difference of the battery cell corresponding to the difference between the first average cell voltage and the second average cell voltage of the battery cell, for each battery cell of the plurality of battery cells, determine a normalization value of the short/long term average difference of the battery cell as a normalized cell diagnosis deviation, determine a statistical adaptive threshold based on a standard deviation for the normalized cell diagnosis deviation of all the plurality of battery cells, for each battery cell of the plurality of battery cells, generate time series data of a filter diagnosis value by filtering time series data for the normalized cell diagnosis deviation of the battery cell based on the statistical adaptive threshold, and detect the abnormal voltage of at least one battery cell based on a period of time during which the filter diagnosis value of the at least one battery cell exceeds a diagnosis threshold, or based on a number of the filter diagnosis value exceeding the diagnosis threshold.

Preferably, the control circuit may for each battery cell of the plurality of battery cells, normalize the short/long term average difference of the battery cell by dividing the short/long term average difference of the battery cell by an average value of short/long term average differences of all the plurality of battery cells.

Alternatively, the control circuit may for each battery cell of the plurality of battery cells, normalize the short/long term average difference of the battery cell through log calculation of the short/long term average difference of the battery cell.

In another aspect, the control circuit may be configured to for each battery cell of the plurality of battery cells, generate time series data indicating a change in cell voltage of the battery cell over time using a voltage difference between a cell voltage average value of all the plurality of battery cells and a cell voltage of the battery cell, measured at each unit time.

In still another aspect, the control circuit may be configured to for each battery cell of the plurality of battery cells, determine a short/long term average difference of the battery cell corresponding to the difference between the first average cell voltage and the second average cell voltage of the battery cell, for each battery cell of the plurality of battery cells, determine a normalization value of the short/long term average difference of the battery cell as a normalized cell diagnosis deviation of the battery cell, generate time series data of the normalized cell diagnosis deviation of the battery cell, for each battery cell of the plurality of battery cells, generate the time series data of the normalized cell diagnosis deviation of the battery cell by recursively repeating: (i) determining a first moving average and a second moving average of the battery cell for the time series data of the normalized cell diagnosis deviation of the battery cell, wherein the first moving average is a short term moving average of the battery cell and the second moving average is a long term moving average of the battery cell, (ii) determining the short/long term average difference of the battery cell corresponding to a difference between the first moving average and the second moving average of the battery cell, (iii) determining the normalization value of the short/long term average difference of the battery cell as the normalized cell diagnosis deviation, and (iv) generating the time series data of the normalized cell diagnosis deviation of the battery cell, determine a statistical adaptive threshold based on a standard deviation for the normalized cell diagnosis deviation of all the plurality of battery cells, for each battery cell of the plurality of battery cells, generate time series data of a filter diagnosis value of the battery cell by filtering the time series data for the normalized cell diagnosis deviation of the battery cell based on the statistical adaptive threshold, and detect the abnormal voltage of at least one battery cell based on a period of time during which the filter diagnosis value of the at least one battery cell exceeds a diagnosis threshold, or based on a number of the filter diagnosis value exceeding the diagnosis threshold.

A battery diagnosis method according to the present disclosure for achieving the above-described object is a battery diagnosis method for a cell group including a plurality of battery cells connected in series, and may include (a) for each battery cell of the plurality of battery cells, periodically generating, by one or more processors, time series data indicating a change in cell voltage of the battery cell over time; (b) for each battery cell of the plurality of battery cells, determining, by the one or more processors, a first average cell voltage and a second average cell voltage of the battery cell based on the time series data, wherein the first average cell voltage is a short term moving average, and the second average cell voltage is a long term moving average; and (c) detecting, by the one or more processors, an abnormal voltage of at least one battery cell based on a difference between the first average cell voltage and the second average cell voltage of the at least one battery cell.

In an aspect, the step (c) may include (c1) for each battery cell of the plurality of battery cells, determining, by the one or more processors, a short/long term average difference of the battery cell corresponding to the difference between the first average cell voltage and the second average cell voltage of the battery cell; (c2) determining, by the one or more processors, a cell diagnosis deviation of the battery cell corresponding to a deviation between an average value of short/long term average differences of all the plurality of battery cells and the short/long term average difference of the battery cell of the battery cell; and (c3) in response to the cell diagnosis deviation exceeding a diagnosis threshold for the at least one battery cell, determining, by the one or more processors, that the at least one battery cell is an abnormal voltage cell.

Preferably, the step (c) may include (c1) for each battery cell of the plurality of battery cells, generating, by the one or more processors, time series data of the cell diagnosis deviation of the battery cell, wherein determining that at least one battery cell of the plurality of battery cells is an abnormal voltage cell occurs either after a period of time during which the cell diagnosis deviation exceeds the diagnosis threshold or after a number of cell diagnosis deviations exceeding the diagnosis threshold exceeds a predetermined number.

In another aspect, the step (c) may include (c1) for each battery cell of the plurality of battery cells, determining, by the one or more processors, a short/long term average difference of the battery cell corresponding to the difference between the first average cell voltage and the second average cell voltage of the battery cell; (c2) determining, by the one or more processors, a cell diagnosis deviation of the battery cell corresponding to a deviation between an average value of short/long term average differences of all the plurality of battery cells and the short/long term average difference of the battery cell; (c3) determining, by the one or more processors, a statistical adaptive threshold based on a standard deviation for the cell diagnosis deviation of all the plurality of battery cells; (c4) for each battery cell of the plurality of battery cells, generating, by the one or more processors, time series data of a filter diagnosis value of the battery cell by filtering time series data for the cell diagnosis deviation of the battery cell based on the statistical adaptive threshold; and (c5) detecting, by the one or more processors, the abnormal voltage of the at least one battery cell based on a period of time during which the filter diagnosis value of the at least one battery cell exceeds a diagnosis threshold, or based on a number of the filter diagnosis value exceeding the diagnosis threshold.

In still another aspect, the step (c) may include (c1) for each battery cell of the plurality of battery cells, determining, by the one or more processors, a short/long term average difference of the battery cell corresponding to the difference between the first average cell voltage and the second average cell voltage of the battery cell; (c2) for each battery cell of the plurality of battery cells, determining, by the one or more processors, a normalization value of the short/long term average difference of the battery cell as a normalized cell diagnosis deviation; (c3) determining, by the one or more processors, a statistical adaptive threshold based on a standard deviation for the normalized cell diagnosis deviation of all the plurality of battery cells; (c4) for each battery cell of the plurality of battery cells, generating, by the one or more processors, time series data of a filter diagnosis value by filtering time series data for the normalized cell diagnosis deviation of the battery cell based on the statistical adaptive threshold; and (c5) detecting, by the one or more processors, the abnormal voltage of the at least one battery cell based on a period of time during which the filter diagnosis value of the at least one battery cell exceeds a diagnosis threshold, or based on a number of data of the filter diagnosis value exceeding the diagnosis threshold.

Preferably, the step (c2) may be a step of for each battery cell of the plurality of battery cells, normalizing, by the one or more processors, the short/long term average difference of the battery cell by dividing the short/long term average difference of the battery cell by an average value of short/long term average differences of all the plurality of battery cells.

Alternatively, the step (c2) may be a step of for each battery cell of the plurality of battery cells, normalizing, by the one or more processors, the short/long term average difference of the battery cell through log calculation of the short/long term average difference of the battery cell.

In another aspect, the step (a) may be a step of for each battery cell of the plurality of battery cells, generating, by the one or more processors, time series data indicating a change in cell voltage of the battery cell over time using a voltage difference between a cell voltage average value of all the plurality of battery cells and a cell voltage of the battery cell, measured at each unit time.

In still another aspect, the step (c) may include (c1) for each battery cell of the plurality of battery cells, determining, by the one or more processors, a short/long term average difference of the battery cell corresponding to the difference between the first average cell voltage and the second average cell voltage of the battery cell; (c2) for each battery cell of the plurality of battery cells, determining, by the one or more processors, a normalization value of the short/long term average difference of the battery as a normalized cell diagnosis deviation of the battery cell; (c3) for each battery cell of the plurality of battery cells, generating, by the one or more processors, time series data of the normalized cell diagnosis deviation of the battery cell; (c4) for each battery cell of the plurality of battery cells, generating, by the one or more processors, the time series data of the normalized cell diagnosis deviation for each battery cell by recursively repeating: (i) determining, by the one or more processors, a first moving average and a second moving average of the battery cell for the time series data of the normalized cell diagnosis deviation of the battery cell, wherein the first moving average is a short term moving average of the battery cell and the second moving average is a long term moving average of the battery cell, (ii) determining the short/long term average difference of the battery cell corresponding to a difference between the first moving average and the second moving average of the battery cell, (iii) determining the normalization value of the short/long term average difference of the battery cell as the normalized cell diagnosis deviation, and (iv) generating the time series data of the normalized cell diagnosis deviation of the battery cell, (c5) determining, by the one or more processors, a statistical adaptive threshold based on a standard deviation for the normalized cell diagnosis deviation of all the plurality battery cells; (c6) for each battery cell of the plurality of battery cells, generating, by the one or more processors, time series data of a filter diagnosis value of the battery cell by filtering the time series data for the normalized cell diagnosis deviation of the battery cell based on the statistical adaptive threshold; and (c7) detecting, by the one or more processors, the abnormal voltage of at least one battery cell based on a period of time during which the filter diagnosis value of the at least one battery cell exceeds a diagnosis threshold, or based on a number of the filter diagnosis value exceeding the diagnosis threshold.

The above-described technical object may be also achieved by a battery pack including the battery diagnosis apparatus as described in any of the embodiments herein and a vehicle including the same.

Advantageous Effects

According to an aspect of the present disclosure, it is possible to achieve efficient and accurate diagnosis of abnormal voltage of each battery cell by determining two moving averages of cell voltage of each battery cell over two different time lengths at each unit time, and carrying out abnormal voltage diagnosis of each battery cell based on a difference between the two moving averages of each of the plurality of battery cells.

According to another aspect of the present disclosure, it is possible to achieve accurate diagnosis of abnormal voltage of each battery cell by applying the advanced techniques such as normalization and/or statistical adaptive threshold to analyze a difference in variation trend of two moving averages of each battery cell.

According to still another aspect of the present disclosure, it is possible to precisely detect the time zone in which the abnormal voltage of each battery cell occurred and/or the abnormal voltage detection count by analyzing the time series data of the filter diagnosis value determined based on the statistical adaptive threshold.

The effects of the present disclosure are not limited to the above-mentioned effects, and these and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
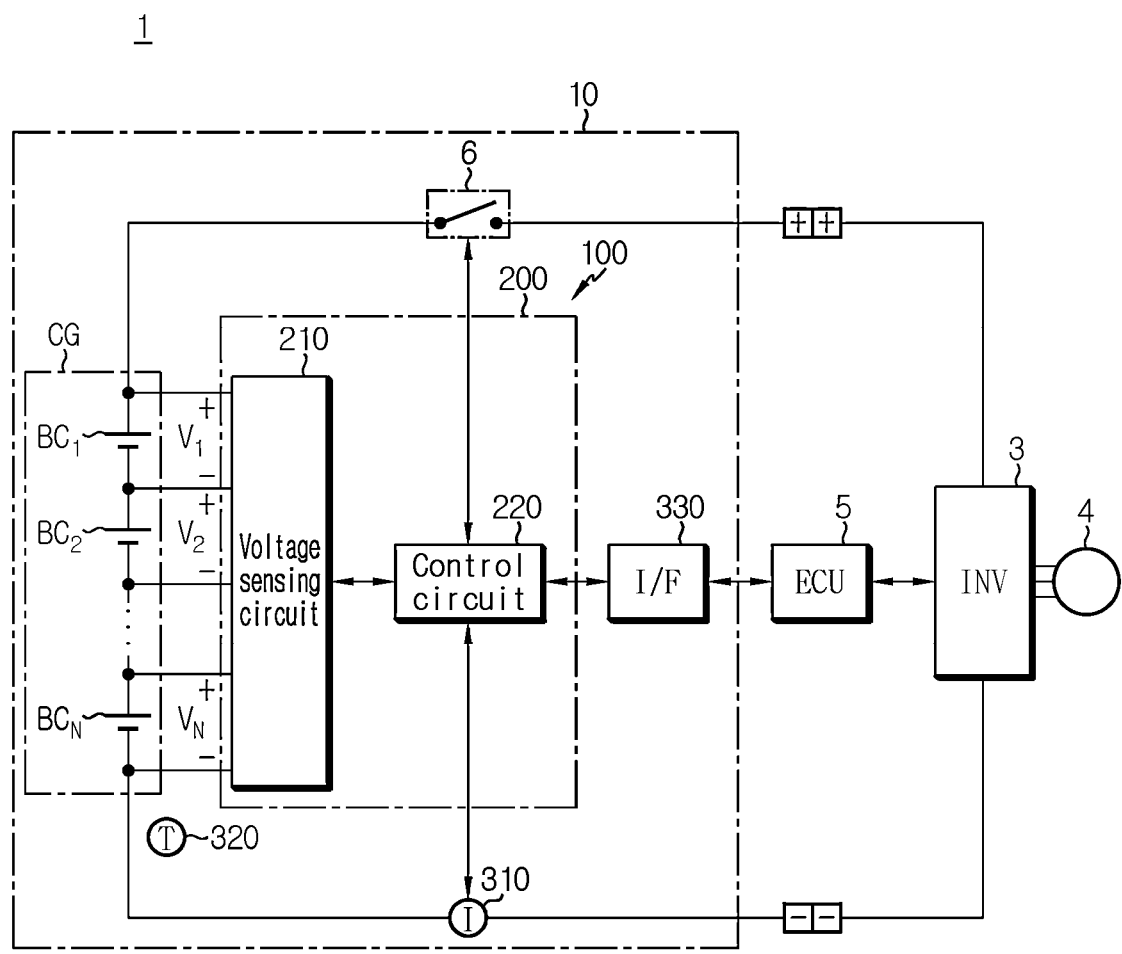
FIG. 1 is a diagram showing exemplarily an electric vehicle according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing element of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram showing exemplarily an electric vehicle according to an embodiment of the present disclosure.

Referring to FIG. 1, the electric vehicle 1 includes a battery pack 2, an inverter 3, an electric motor 4 and a vehicle controller 5.

The battery pack 2 includes a cell group CG, a switch 6 and a battery management system 100.

The cell group CG may be coupled to the inverter 3 through a pair of power terminals provided in the battery pack 2. The cell group CG includes a plurality of battery cells $BC_1 \sim BC_N$ (N is a natural number of 2 or greater) connected in series. Each battery cell $BC_i$ is not limited to a particular type, and may include any battery cell that can be recharged such as a lithium ion battery cell. i is an index for cell identification. i is a natural number and is between 1 and N.

The switch 6 is connected in series to the cell group CG. The switch 6 is installed on a current path for the charge/discharge of the cell group CG. The switch 6 is controlled between an on state and an off state in response to a switching signal from the battery management system 100. The switch 6 may be a mechanical relay which is turned on/off by the electromagnetic force of a coil, or a semiconductor switch such as a Metal Oxide Semiconductor Field Effect transistor (MOSFET).

The inverter 3 is provided to convert the direct current (DC) power from the cell group CG to alternating current (AC) power in response to a command from the battery management system 100. The electric motor 4 may be, for example, a three-phase AC motor. The electric motor 4 operates using the AC power from the inverter 3.

The battery management system 100 is provided to take general control related to the charge/discharge of the cell group CG.

The battery management system 100 includes a battery diagnosis apparatus 200. The battery management system 100 may further include at least one of a current sensor 310, a temperature sensor 320 and an interface unit 330.

The battery diagnosis apparatus 200 is provided for abnormal voltage diagnosis of each of the plurality of battery cells $BC_1 \sim BC_N$. The battery diagnosis apparatus 200 includes a voltage sensing circuit 210 and a control circuit 220.

The voltage sensing circuit 210 is connected to positive and negative electrodes of each of the plurality of battery cells $BC_1 \sim BC_N$ through a plurality of voltage sensing lines. The voltage sensing circuit 210 is configured to measure a cell voltage across each battery cell BC and generate a voltage signal indicating the measured cell voltage.

The current sensor 310 is connected in series to the cell group CG through the current path. The current sensor 310 is configured to detect a battery current flowing through the cell group CG, and generate a current signal indicating the detected battery current.

The temperature sensor 320 is configured to detect a temperature of the cell group CG and generate a temperature signal indicating the detected temperature.

The control circuit 220 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control circuit 220 may have a memory unit. The memory unit may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM), or programmable read-only memory (PROM). The memory unit may store data and programs required for computation by the control circuit 220. The memory unit may store data indicating the results of computation performed by the control circuit 220. In particular, the control circuit 220 may record at least one of a plurality of parameters calculated at each unit time as described below in the memory unit.

The control circuit 220 may be operably coupled to the voltage sensing circuit 210, the temperature sensor 320, the current sensor 310, the interface unit 330 and/or the switch 6. The control circuit 220 may collect a sensing signal from the voltage sensing circuit 210, the current sensor 310 and the temperature sensor 320. The sensing signal refers to the voltage signal, the current signal and/or the temperature signal detected in synchronization manner.

The interface unit 330 may include a communication circuit configured to support wired or wireless communication between the control circuit 220 and the vehicle controller 5 (for example, an Electronic Control Unit (ECU). The wired communication may be, for example, controller area network (CAN) communication, and the wireless communication may be, for example, Zigbee or Bluetooth communication. The communication protocol is not limited to a particular type, and may include any communication protocol that supports the wired/wireless communication between the control circuit 220 and the vehicle controller 5.

The interface unit 330 may be coupled to an output device (for example, a display, a speaker) which provides information received from the vehicle controller 5 and/or the control circuit 220 in a recognizable format. The vehicle controller 5 may control the inverter 3 based on battery information (for example, voltage, current, temperature, SOC) collected via communication with the battery management system 100.

FIGS. 2*a* to 2*h* are graphs showing exemplarily a process for abnormal voltage diagnosis of each battery cell from time series data indicating a change in cell voltage of each of the plurality of battery cells shown in FIG. 1 over time.

Figure 2A:
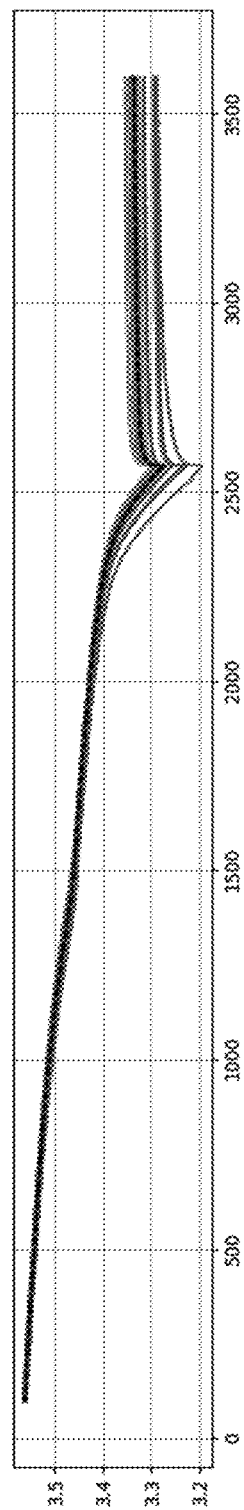
FIGS. 2a to 2h are graphs referenced in describing a process for abnormal voltage diagnosis of each battery cell from time series data indicating a change in cell voltage of each of the plurality of battery cells shown in FIG. 1 over time.

FIG. 2*a* shows a voltage curve of each of the plurality of battery cells $BC_1 \sim BC_N$. The number of battery cells is 14. The control circuit 220 collects the voltage signal from the voltage sensing circuit 210 at each unit time, and records a voltage value of cell voltage of each battery cell $BC_i$ in the memory unit. The unit time may be an integer multiple of the voltage measurement cycle of the voltage sensing circuit 210.

The control circuit 220 may generate cell voltage time series data indicating a cell voltage history of each battery cell over time based on the voltage value of cell voltage of each battery cell $BC_i$ recorded in the memory unit. The number of cell voltage time series data increases by 1 each time the cell voltage is measured.

The plurality of voltage curves shown in FIG. 2*a* correlates with the plurality of battery cells $BC_1 \sim BC_N$ in a one-to-one relationship. Accordingly, each voltage curve indicates a cell voltage change history of any one battery cell BC associated therewith.

The control circuit 220 may determine a moving average of each of the plurality of battery cells $BC_1 \sim BC_N$ at each unit time using one or two moving windows. When two moving windows are used, the time length of any one moving window is different from the time length of the other moving widow.

Here, the time length of each moving window is the integer multiple of the unit time, and the ending point of each moving window is the present time and the starting point of each moving window is a time point which is a given time length earlier than the present time.

Hereinafter, for convenience of description, of the two moving windows, a moving window associated with a shorter time length is referred to as a first moving window, and a moving window associated with a longer time length is referred to as a second moving window.

The control circuit 220 may carry out abnormal voltage diagnosis of each battery cell $BC_i$ using the first moving window alone or both the first moving window and the second moving window.

The control circuit 220 may compare a short term change trend and a long term change trend of cell voltage of an $i^{th}$ battery cell $BC_i$ at each unit time based on the cell voltage of the $i^{th}$ battery cell $BC_i$ collected at each unit time.

The control circuit 220 may determine a first average cell voltage, i.e., a moving average of the $i^{th}$ battery cell $BC_i$ by the first moving window at each unit time using the following Equation 1 or 2.

Equation 1 is a moving average calculation equation by an arithmetic average method, and Equation 2 is a moving average calculation equation by a weighted average method.

$$SMA_i[k] = \frac{\sum_{j=1}^{S} V_i[k - S + j]}{S} \qquad \text{<Equation 1>}$$

$$SMA_i[k] = \frac{SMA_i[k-1] \times (S-1)}{S} + \frac{V_i[k]}{S} \qquad \text{<Equation 2>}$$

In Equations 1 and 2, k is a time index indicating the present time, $SMA_i[k]$ is the first average cell voltage of the $i^{th}$ battery cell $BC_i$ at the present time, S is a value obtained by dividing the time length of the first moving window by the unit time, and $V_i[k]$ is the cell voltage of the $i^{th}$ battery cell $BC_i$ at the present time. For example, when the unit time is 1 sec and the time length of the first moving window is 10 sec, S is 10. When x is a natural number of k or smaller, $V_i[k-x]$ and $SMA_i[k-x]$ indicate the cell voltage of the $i^{th}$ battery cell $BC_i$ and the first average cell voltage when the time index is k−x, respectively. For reference, the control circuit 220 may be set to increase the time index by 1 at each unit time.

The control circuit 220 may determine a second average cell voltage which is a moving average of the $i^{th}$ battery cell $BC_i$ by the second moving window at each unit time using the following Equation 3 or 4.

Equation 3 is a moving average calculation equation by an arithmetic average method, and Equation 4 is a moving average calculation equation by a weighted average method.

$$LMA_i[k] = \frac{\sum_{j=1}^{L} V_i[k-L+j]}{L} \quad \text{<Equation 3>}$$

$$LMA_i[k] = \frac{LMA_i[k-1] \times (L-1)}{L} + \frac{V_i[k]}{L} \quad \text{<Equation 4>}$$

In Equations 3 and 4, k is the time index indicating the present time, $LMA_i[k]$ is the second average cell voltage of the $i^{th}$ battery cell $BC_i$ at the present time, L is a value obtained by dividing the time length of the second moving window by the unit time, and $V_i[k]$ is the cell voltage of the $i^{th}$ battery cell $BC_i$ at the present time. For example, when the unit time is 1 sec and the time length of the second moving window is 100 sec, L is 100. When x is a natural number of k or smaller, $LMA_i[k-x]$ denotes the second average cell voltage when the time index is k-x.

In an embodiment, the control circuit 220 may input, as $V_i[k]$ of Equation 1 to 4, a difference between a reference cell voltage of the cell group CG and the cell voltage of the battery cell $BC_i$ at the present time, instead of the cell voltage of each battery cell $BC_i$ at the present time.

The reference cell voltage of the cell group CG at the present time is an average value of the plurality of cell voltages at the present time determined from the plurality of battery cells $BC_i$~$BC_N$. In a variation, the average value of the plurality of cell voltages may be replaced with a median value thereof.

Specifically, the control circuit 220 may set $VD_i[k]$ of the following Equation 5 as $V_i[k]$ of Equations 1 to 4.

$$VD_i[k] = V_{av}[k] - V_i[k] \quad \text{<Equation 5>}$$

In Equation 5, $V_{av}[k]$ is the reference cell voltage of the cell group CG at the present time and is the average value of the plurality of cell voltages.

When the time length of the first moving window is shorter than the time length of the second moving window, the first average cell voltage may be referred to as a 'short term moving average' of cell voltage, and the second average cell voltage may be referred to as a 'long term moving average' of cell voltage.

Figure 2B:
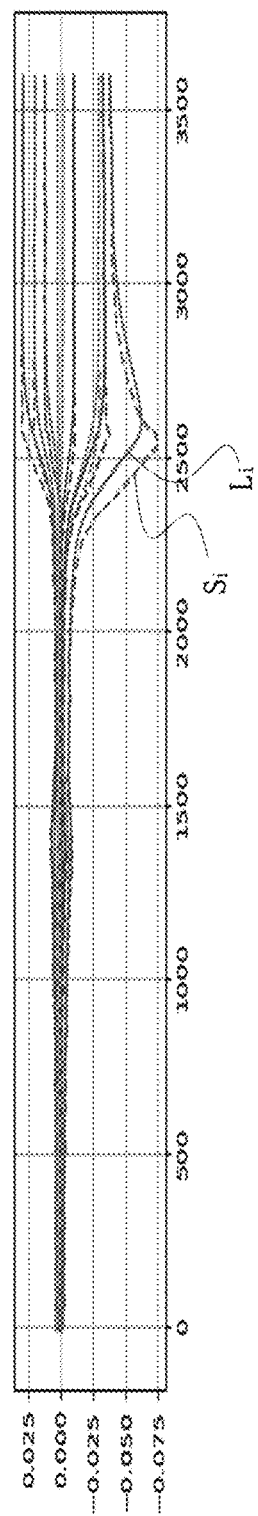

FIG. 2b shows a short term moving average line and a long term moving average line for the cell voltage of the $i^{th}$ battery cell $BC_i$ determined from the plurality of voltage curves shown in FIG. 2a. In FIG. 2b, the horizontal axis indicates time, and the vertical axis indicates a short term moving average and a long term moving average of cell voltage.

Referring to FIG. 2b, the plurality of moving average lines $S_i$ indicated in the dashed line is associated with the plurality of battery cells $BC_i$~$BC_N$ in a one-to-one relationship, and indicates a change history of the first average cell voltage $SMA_i[k]$ of each battery cell BC over time. Additionally, the plurality of moving average lines $L_i$ indicated in the solid line is associated with the plurality of battery cells $BC_1$~$BC_N$ in a one-to-one relationship, and indicates a change history of the second average cell voltage $LMA_i[k]$ of each battery cell BC over time.

The dotted line graph and the solid line graph are obtained using Equations 2 and 4, respectively. Additionally, $VD_i[k]$ of Equation 5 is used as $V_i[k]$ of Equations 2 and 4, and $V_{av}[k]$ is set as an average of the plurality of cell voltages. The time length of the first moving window is 10 sec, and the time length of the second moving window is 100 sec.

Figure 2C:
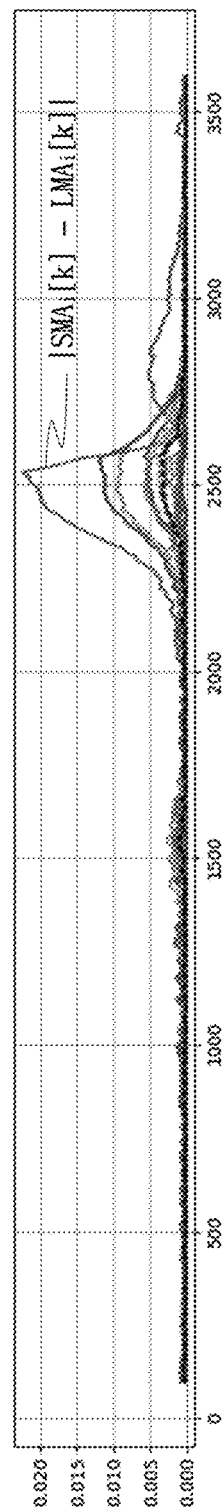

FIG. 2c shows a time-dependent change in short/long term average difference (an absolute value) corresponding to a difference between the first average cell voltage $SMA_i[k]$ and the second average cell voltage $LMA_i[k]$ of each battery cell shown in FIG. 2b. In FIG. 2c, the horizontal axis indicates time, and the vertical axis indicates the short/long term average difference of each battery cell $BC_i$.

The short/long term average difference of each battery cell $BC_i$ is a difference between the first average cell voltage $SMA_i$ and the second average cell voltage $LMA_i$ of each battery cell $BC_i$ at each unit time. For example, the short/long term average difference of the $i^{th}$ battery cell $BC_i$ may be equal to a value of subtracting one (for example, a smaller one) of $SMA_i[k]$ and $LMA_i[k]$ from the other (for example, a larger one).

The short/long term average difference of the $i^{th}$ battery cell $BC_i$ relies on the short-term change history and the long-term change history of cell voltage of the $i^{th}$ battery cell $BC_i$.

The temperature or SOH of the $i^{th}$ battery cell $BC_i$ steadily affects the cell voltage of the $i^{th}$ battery cell $BC_i$ for a short term as well as a long term. Accordingly, in case that there is no abnormal voltage in the $i^{th}$ battery cell $BC_i$ there is no significant difference between the short/long term average difference of the $i^{th}$ battery cell $BC_i$ and the short/long term average differences of the remaining battery cells.

In contrast, the abnormal voltage suddenly occurred in the $i^{th}$ battery cell $BC_i$ due to an internal circuit short and/or an external short circuit affects the first average cell voltage $SMA_i[k]$ more greatly than the second average cell voltage $LMA_i[k]$. As a result, the short/long term average difference of the $i^{th}$ battery cell $BC_i$ has a large deviation from the short/long term average differences of the remaining battery cells having no abnormal voltage.

The control circuit 220 may determine the short/long term average difference $|SMA_i[k] - LMA_i[k]|$ of each battery cell $BC_i$ at each unit time. Additionally, the control circuit 220 may determine an average value of short/long term average differences $|SMA_i[k] - LMA_i[k]|$. Hereinafter, the average value is indicated as $|SMA_i[k] - LMA_i[k]|_{av}$. Additionally, the control circuit 220 may determine, as a cell diagnosis deviation $D_{diag,i}[k]$, a deviation for the short/long term average difference $|SMA_i[k] - LMA_i[k]|$ relative to the average value $|SMA_i[k] - LMA_i[k]|_{av}$ of short/long term average differences. Additionally, the control circuit 220 may carry out abnormal voltage diagnosis of each battery cell $BC_i$ based on the cell diagnosis deviation $D_{diag,i}[k]$.

In an embodiment, the control circuit 220 may diagnose that there is an abnormal voltage in the corresponding $i^{th}$ battery cell $BC_i$ when the cell diagnosis deviation $D_{diag,i}[k]$ for the $i^{th}$ battery cell $BC_i$ exceeds a preset diagnosis threshold (for example, 0.015).

Preferably, the control circuit 220 may normalize the short/long term average difference $|SMA_i[k] - LMA_i[k]|$ of each battery cell $BC_i$ using a normalization reference value for abnormal voltage diagnosis. Preferably, the normalization reference value is an average value $|SMA_i[k]-LMA_i[k]|_{av}$ of the short/long term average differences.

Specifically, the control circuit 220 may set the average value $|SMA_i[k]-LMA_i[k]|_{av}$ of short/long term average differences of first to $N^{th}$ battery cells $BC_i$-$BC_N$ as the normalization reference value. Additionally, the control circuit 220 normalize the short/long term average difference $|SMA_i[k]-LMA_i[k]|$ by dividing the short/long term average difference $|SMA_i[k]-LMA_i[k]|$ of each battery cell $BC_i$ by the normalization reference value.

The following Equation 6 is an equation for normalization of the short/long term average difference $|SMA_i[k]-LMA_i[k]|$ of each battery cell $BC_i$. In an embodiment, the product of Equation 6 may be referred to as a normalized cell diagnosis deviation $D^*_{diag,i}[k]$.

$$D^*_{diag,i}[k]=(|SMA_i[k]-LMA_i[k]|)\div(|SMA_i[k]-LMA_i[k]|_{av}) \quad \text{<Equation 6>}$$

In Equation 6, $|SMA_i[k]-LMA_i[k]|$ is the short/long term average difference of the $i^{th}$ battery cell $BC_i$ at the present time, $|SMA_i[k]-LMA_i[k]|_{av}$ is the average value (the normalization reference value) of short/long term average differences of all the battery cells, and $D^*_{diag,i}[k]$ is the normalized cell diagnose deviation of the $i^{th}$ battery cell $BC_i$ at the present time. The symbol indicates that the parameter is normalized.

The short/long term average difference $|SMA_i-LMA_i[k]|$ of each battery cell $BC_i$ may be normalized through log calculation of the following Equation 7. In an embodiment, the product of Equation 7 may be also referred to as the normalized cell diagnosis deviation $D^*_{diag,i}[k]$.

$$D^*_{diag,i}[k]=\text{Log}|SMA_i[k]-LMA_i[k]| \quad \text{<Equation 7>}$$

Figure 2D:
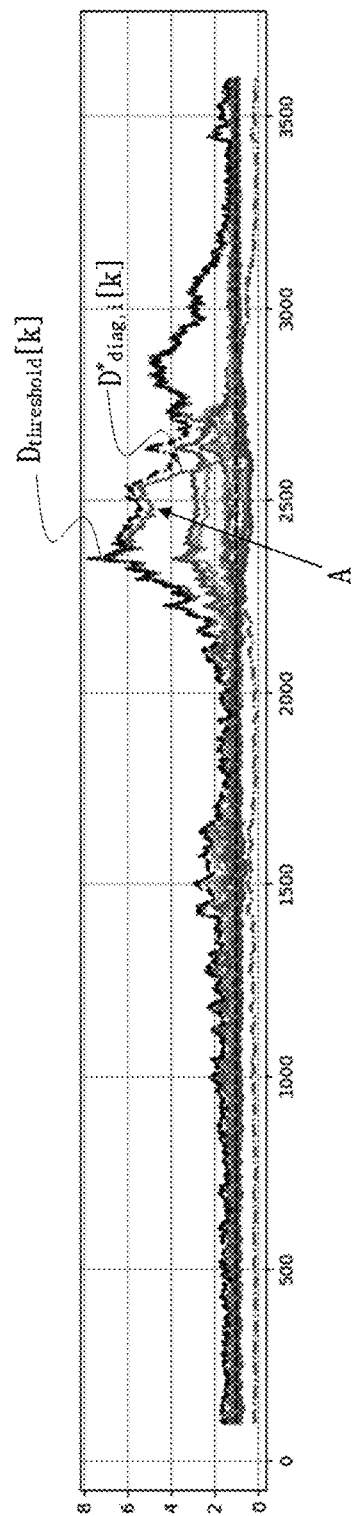

FIG. 2*d* shows a change in the normalized cell diagnosis deviation $D^*_{diag,i}[k]$ of each battery cell $BC_i$ over time. The cell diagnosis deviation $D^*_{diag,i}[k]$ is calculated using Equation 6. In FIG. 2*d*, the horizontal axis indicates time, and the vertical axis indicates the cell diagnosis deviation $D^*_{diag,i}[k]$ of each battery cell $BC_i$.

Referring to FIG. 2*d*, it can be seen that the change in short/long term average difference of each battery cell $BC_i$ is amplified on the basis of the average value by the normalization of the short/long term average difference $|SMA_i-LMA_i[k]|$ of each battery cell $BC_i$. Accordingly, it is possible to achieve more accurate diagnosis of abnormal voltage of the battery cell.

Preferably, the control circuit 220 may carry out abnormal voltage diagnosis of each battery cell $BC_i$ by comparing the normalized cell diagnosis deviation $D^*_{diag,i}[k]$ of each battery cell $BC_i$ with a statistical adaptive threshold $D_{threshold}[k]$.

Preferably, the control circuit 220 may set the statistical adaptive threshold $D_{threshold}[k]$ using Equation 8 at each unit time.

$$D_{threshold}[k]\beta^*\text{Sigma}(D^*_{diag,i}[k]) \quad \text{<Equation 8>}$$

In Equation 8, Sigma is a function which calculates the standard deviation for the normalized cell diagnosis deviation $D^*_{diag,i}[k]$ of all the battery cells BC at the time index k. Additionally, $\beta$ is an experimentally determined constant. $\beta$ is a factor which determines diagnosis sensitivity. When the present disclosure is performed on a cell group including a battery cell in which abnormal voltage actually occurred, $\beta$ may be appropriately determined by trial and error to detect the corresponding battery cell as an abnormal voltage cell. In an example, $\beta$ may be set to at least 5, or at least 6, or at least 7, or at least 8, or at least 9. $D_{threshold}[k]$ generated by Equation 8 is multiple and constructs time series data.

Meanwhile, the normalized cell diagnosis deviation $D^*_{diag,i}[k]$ for the battery cell in abnormal voltage condition is larger than that of a normal battery cell. Accordingly, to improve the accuracy and reliability of diagnosis, in the calculation of Sigma($D^*_{diag,i}[k]$) at the time index k, it is desirable to exclude max($D^*_{diag,i}[k]$) corresponding to the maximum value. Here, max is a function which returns a maximum value for a plurality of input parameters, and the input parameters are the normalized cell diagnosis deviations $D^*_{diag,i}[k]$ of all the battery cells.

In FIG. 2*d*, the time series data indicating a change of the statistical adaptive threshold $D_{threshold}[k]$ over time corresponds to the profile in the darkest color among all the profiles.

After determining the statistical adaptive threshold $D_{threshold}[k]$ at the time index k, the control circuit 220 may determine a filter diagnosis value $D_{filter,i}[k]$ by filtering the normalized cell diagnosis deviation $D^*_{diag,i}[k]$ of each battery cell $BC_i$ using the following Equation 9.

Two values may be assigned to the filter diagnosis value $D_{filter,i}[k]$ for each battery cell $BC_i$. That is, in case that the cell diagnosis deviation $D^*_{diag,i}[k]$ is larger than the statistical adaptive threshold $D_{threshold}[k]$, a difference value between the cell diagnosis deviation $D^*_{diag,i}[k]$ and the statistical adaptive threshold $D_{Threshold}[k]$ is assigned to the filter diagnosis value $D_{filter,i}[k]$. In contrast, in case that the cell diagnosis deviation $D^*_{diag,i}[k]$ is equal to or smaller than the statistical adaptive threshold $D_{threshold}[k]$, 0 is assigned to the filter diagnosis value $D_{filter,i}[k]$.

$$D_{filter,i}[k]=D^*_{diag,i}[k]-D_{threshold}[k]$$
$$(\text{IF } D^*_{diag,i}[k]>D_{threshold}[k])$$

$$D_{filter,i}[k]=0 (\text{IF } D^*_{diag,i}[k]\le D_{threshold}[k]) \quad \text{<Equation 9>}$$

Figure 2E:
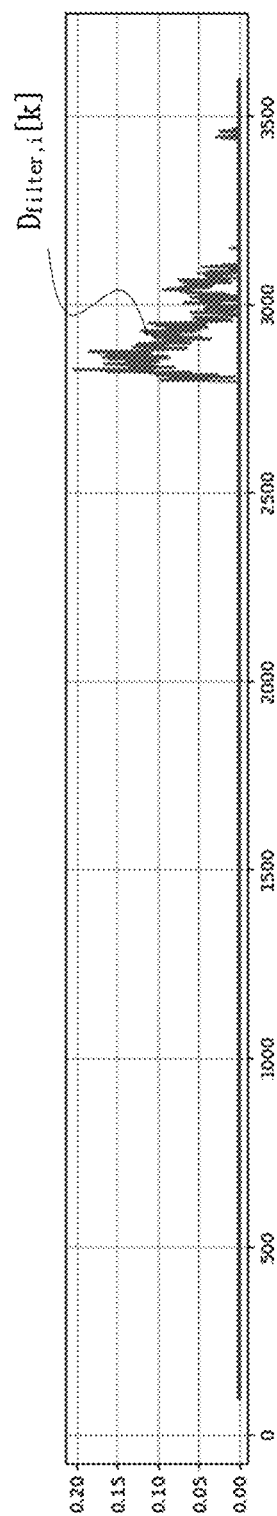

FIG. 2*e* is a diagram showing time series data of the filter diagnosis value $D_{filter,i}[k]$ obtained through the filtering of the cell diagnosis deviation $D^*_{diag,i}[k]$ at the time index k.

Referring to FIG. 2*e*, an irregular pattern shows that the filter diagnosis value $D_{filter,i}[k]$ of a specific battery cell has a positive value at about 3000 sec. For reference, the specific battery cell having the irregular pattern is the battery cell having the time series data indicated by A in FIG. 2*d*.

In an example, the control circuit 220 may accumulate time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the accumulation time is larger than a preset reference time as the abnormal voltage cell.

Preferably, the control circuit 220 may accumulate time step which successively meets the requirement that the filter diagnosis value $D_{filter,i}[k]$ is larger than the diagnosis threshold. When the corresponding time step is multiple, the control circuit 220 may independently calculate the accumulation time at each time step.

In another example, the control circuit 220 may accumulate the number of data included in the time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the data number accumulated value is larger than a preset reference count as the abnormal voltage cell.

Preferably, the control circuit 220 may accumulate only the number of data included in the time step which successively meets the requirement that the filter diagnosis value $D_{filter,i}[k]$ is larger than the diagnosis threshold. When the corresponding time step is multiple, the control circuit 220 may independently accumulate the number of data of each time step.

Meanwhile, the control circuit 220 may replace $V_i[k]$ of Equations 1 to 5 with the normalized cell diagnosis deviation $D^*_{diag,i}[k]$ of each battery cell $BC_i$ shown in FIG. 2*d*. Additionally, the control circuit 220 may recursively perform the calculation of the short/long term average difference $|SMA_i[k]-LMA_i[k]|$ of the cell diagnosis deviation $D^*_{diag,i}[k]$, calculation of the average value of short/long term average differences $|SMA_i[k]-LMA_i[k]|$ of the cell diagnosis deviation $D^*_{diag,i}[k]$, calculation of the cell diagnosis deviation $D^*_{diag,i}[k]$ corresponding to a difference of the short/long term average difference $|SMA_i[k]-LMA_i[k]|$ compared to the average value, calculation of the normalized cell diagnosis deviation $D^*_{diag,i}[k]$ for the short/long term average difference $|SMA_i[k]-LMA_i[k]|$ using Equation 6, determination of the statistical adaptive threshold $D_{threshold}[k]$ for the normalized cell diagnosis deviation $D^*_{diag,i}[k]$ using Equation 8, determination of the filter diagnosis value $D_{filter,i}[k]$ through the filtering of the cell diagnosis deviation $D^*_{diag,i}[k]$ using Equation 9, and abnormal voltage diagnosis of the battery cell using the time series data of the filter diagnosis value $D_{filter,i}[k]$, at the time index k.

Figure 2F:
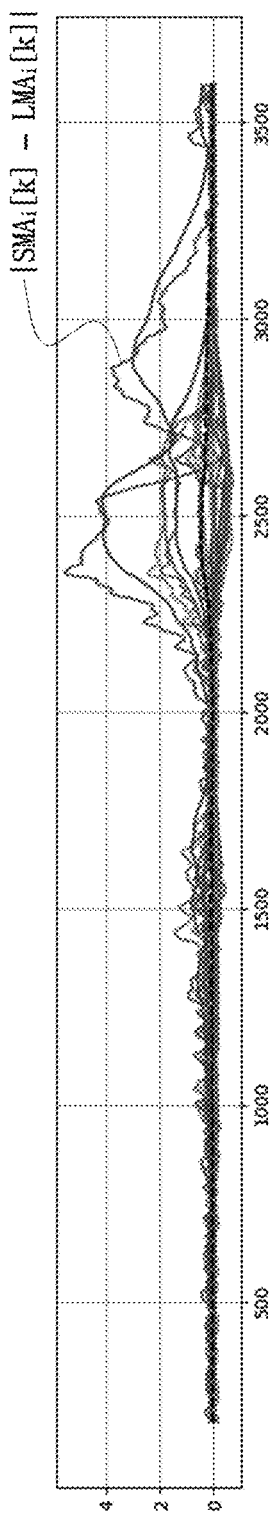

FIG. 2*f* is a graph showing a time change of the short/long term average difference $|SMA_i[k]-LMA_i[k]|$ for the time series data (FIG. 2*d*) of the normalized cell diagnosis deviation $D^*_{diag,i}[k]$. In Equations 2, 4 and 5 used to calculate the short/long term average difference $|SMA_i[k]-LMA_i[k]|$, $V_i[k]$ may be replaced with $D^*_{diag,i}[k]$, and $V_{av}[k]$ may be replaced with the average value of $D^*_{diag,i}[k]$.

Figure 2G:
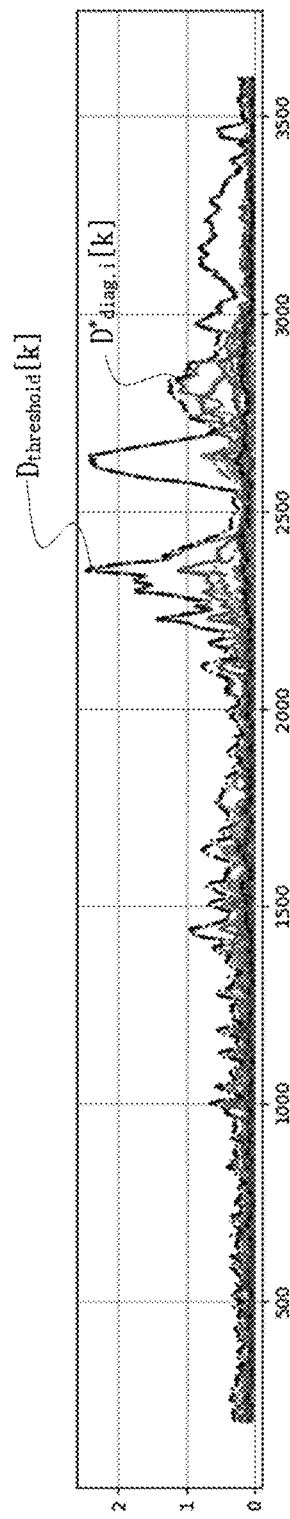

FIG. 2*g* is a graph showing the time series data of the normalized cell diagnosis deviation $D^*_{diag,i}[k]$ calculated using Equation 6. In FIG. 2*g*, the time series data of the statistical adaptive threshold $D_{threshold}[k]$ corresponds to the profile indicated in the darkest color.

Figure 2H:

FIG. 2*h* is the profile showing the time series data of the filter diagnosis value $D_{filter,i}[k]$ obtained by filtering the time series data of the cell diagnosis deviation $D^*_{diag,i}[k]$ using Equation 9.

In an example, the control circuit 220 may accumulate time step in which the filter diagnosis value ($D_{filter,i}[k]$) is larger than the diagnosis threshold (for example, 0) in the time series data of the filter diagnosis value $D_{filter,i}[k]$ for each battery cell $BC_i$, and diagnose the battery cell which meets the requirement that the accumulation time is larger than the preset reference time as the abnormal voltage cell.

Preferably, the control circuit 220 may accumulate time step which successively meets the requirement that the filter diagnosis value $D_{filter,i}[k]$ is larger than the diagnosis threshold. When the corresponding time step is multiple, the control circuit 220 may independently calculate the accumulation time at each time step.

In another example, the control circuit 220 may accumulate the number of data included in the time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the data number accumulated value is larger than the preset reference count as the abnormal voltage cell.

Preferably, the control circuit 220 may accumulate only the number of data included in the time step which successively meets the requirement that the filter diagnosis value $D_{filter,i}[k]$ is larger than the diagnosis threshold. When the corresponding time step is multiple, the control circuit 220 may independently accumulate the number of data of each time step.

The control circuit 220 may additionally repeat the above-described recursive calculation process a reference number of times. That is, the control circuit 220 may replace the voltage time series data shown in FIG. 2*a* with the time series data (for example, data of FIG. 2*g*) of the normalized cell diagnosis deviation $D^*_{diag,i}[k]$. Additionally, the control circuit 220 may recursively perform the calculation of the short/long term average difference $|SMA_i[k]-LMA_i[k]|$, calculation of the average value of the short/long term average difference $|SMA_i[k]-LMA_i[k]|$, calculation of the cell diagnosis deviation $D_{diag,i}[k]$ corresponding to a difference of the short/long term average difference $|SMA_i[k]-LMA_i[k]|$ compared to the average value, calculation of the normalized cell diagnosis deviation $D^*_{diag,i}[k]$ for the short/long term average difference $|SMA_i[k]-LMA_i[k]|$ using Equation 6, determination of the statistical adaptive threshold $D_{threshold}[k]$ for the cell diagnosis deviation $D^*_{diag,i}[k]$ using Equation 8, determination of the filter diagnosis value $D_{filter,i}[k]$ through the filtering of the cell diagnosis deviation $D^*_{diag,i}[k]$ using Equation 9, and abnormal voltage diagnosis of the battery cell using the time series data of the filter diagnosis value $D_{filter,i}[k]$, at the time index k.

When the recursive calculation process as described above is repeated, abnormal voltage diagnosis of the battery cell may be performed more precisely. That is, referring to FIG. 2*e*, a positive profile pattern is observed in only two time steps in the time series data of the filter diagnosis value $D_{filter,i}[k]$ of the battery cell in abnormal voltage condition. However, referring to FIG. 2*h*, a positive profile pattern is observed over more time steps than FIG. 2*e* in the time series data of the filter diagnosis value $D_{filter,i}[k]$ of the battery cell in abnormal voltage condition. Accordingly, when the recurrent computation process is iteratively performed, it is possible to detect the time at which the abnormal voltage of the battery cell occurred more accurately.

Hereinafter, a battery diagnosis method using the above-described battery diagnosis apparatus 200 of the present disclosure will be described in detail. The operation of the control circuit 220 will be described in more detail in various embodiments of the battery diagnosis method.

Figure 3:
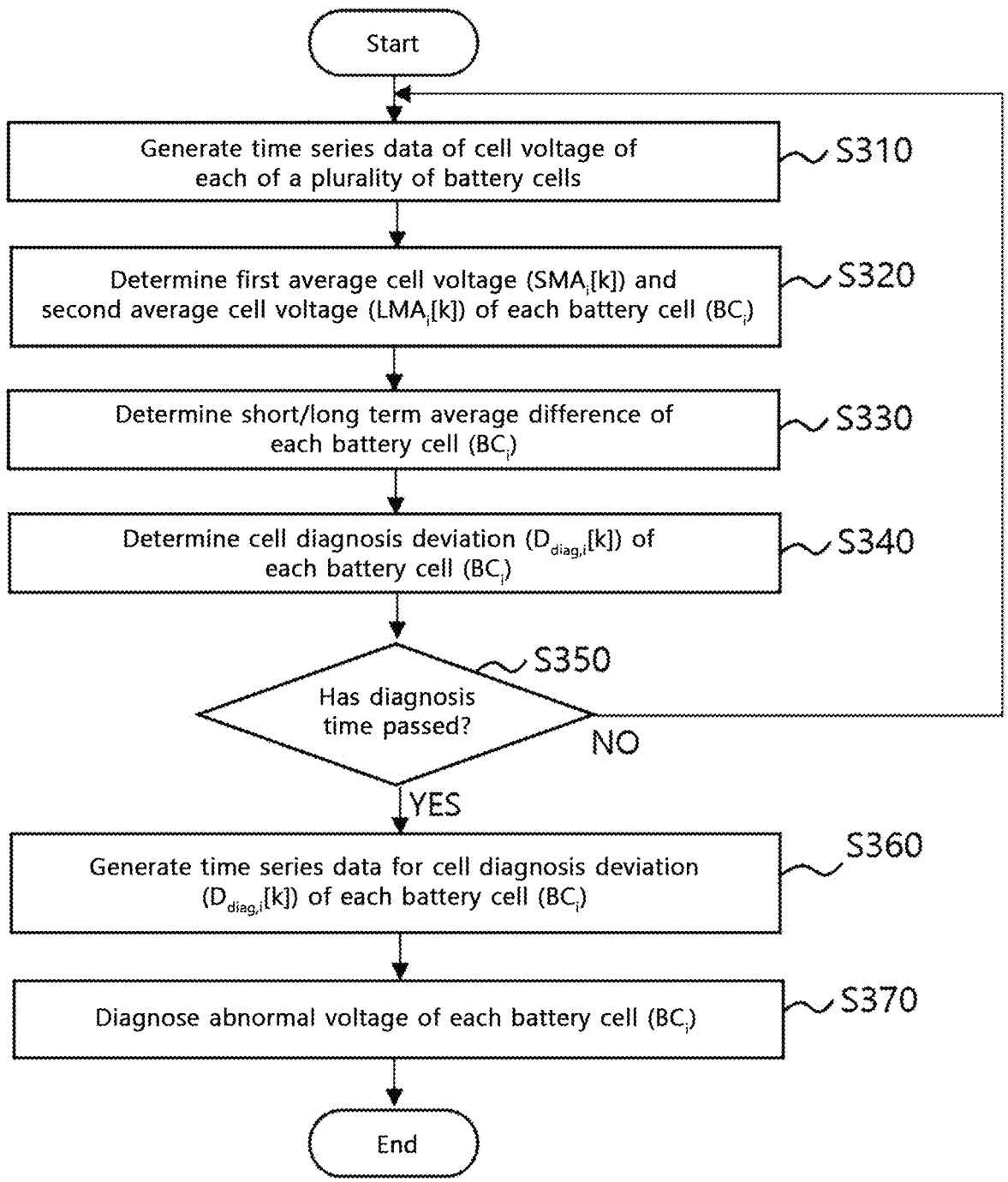
FIG. 3 is a flowchart showing exemplarily a battery diagnosis method according to a first embodiment of the present disclosure.

FIG. 3 is a flowchart showing exemplarily a battery diagnosis method according to a first embodiment of the present disclosure. The method of FIG. 3 may be periodically performed by the control circuit 220 at each unit time.

Referring to FIGS. 1 to 3, in step S310, the control circuit 220 collects the voltage signal indicating the cell voltage of each of the plurality of battery cells $BC_1 \sim BC_N$ from the voltage sensing circuit 210, and generates the time series data of cell voltage of each battery cell BC (see FIG. 2*a*). The number of time series data of cell voltage increases by 1 at each unit time.

Preferably, $V_i[k]$ or $VD_i[k]$ of Equation 5 may be used as the cell voltage.

In step S320, the control circuit 220 determines the first average cell voltage $SMA_i[k]$ (see Equations 1 and 2) and the second average cell voltage $LMA_i[k]$ (see Equations 3 and 4) of each battery cell $BC_i$ based on the time series data of cell voltage of each battery cell $BC_i$ (see FIG. 2*b*). The first average cell voltage $SMA_i[k]$ is a short term moving average of cell voltage of each battery cell $BC_i$ over the first moving window having a first time length. The second average cell voltage $LMA_i[k]$ is a long term moving average of cell voltage of each battery cell $BC_i$ over the second moving window having a second time length. $V_i[k]$ or $VD_i[k]$ may be used to calculate the first average cell voltage $SMA_i[k]$ and the second average cell voltage $LMA_i[k]$.

In step S330, the control circuit 220 determines the short/long term average difference $|SMA_i[k]-LMA_i[k]|$ of each battery cell $BC_i$ (see FIG. 2c).

In step S340, the control circuit 220 determines the cell diagnosis deviation $D^*_{diag,i}[k]$ of each battery cell $BC_i$. The cell diagnosis deviation $D^*_{diag,i}[k]$ is a deviation between the average value $|SMA_i[k]-LMA_i[k]|_{av}$ of short/long term average differences of all the battery cells and the short/long term average difference $|SMA_i[k]-LMA_i[k]|$ of the $i^{th}$ battery cell $BC_i$.

In step S350, the control circuit 220 determines whether the diagnosis time has passed. The diagnosis time is preset. When the determination of the step S350 is YES, step S360 is performed, and when the determination of the step S350 is NO, the steps S310 to S340 are repeated.

In step S360, the control circuit 220 generates the time series data of the cell diagnosis deviation $D^*_{diag,i}[k]$ of each battery cell $BC_i$ collected for the diagnosis time.

In step S370, the control circuit 220 carries out abnormal voltage diagnosis of each battery cell $BC_i$ by analyzing the time series data for the cell diagnosis deviation $D_{diag,i}[k]$.

In an example, the control circuit 220 may accumulate time step in which the cell diagnosis deviation $D_{diag,i}[k]$ is larger than the diagnosis threshold (for example, 0.015) in the time series data for the cell diagnosis deviation $D_{diag,i}[k]$ of each battery cell $BC_i$ and diagnose the battery cell which meets the requirement that the accumulation time is larger than the preset reference time as the abnormal voltage cell.

Preferably, the control circuit 220 may accumulate only time step which successively meets the requirement that the cell diagnosis deviation $D_{diag,i}[k]$ is larger than the diagnosis threshold. When the corresponding time step is multiple, the control circuit 220 may independently calculate the accumulation time at each time step.

In another example, the control circuit 220 may accumulate the number of data in which the cell diagnosis deviation $D_{diag,i}[k]$ is larger than the diagnosis threshold (for example, 0.015) in the time series data for the cell diagnosis deviation $D_{diag,i}[k]$ of each battery cell $BC_i$, and diagnose the battery cell which meets the requirement that the data number accumulated value is larger than the preset reference count as the abnormal voltage cell.

Preferably, the control circuit 220 may accumulate only the number of data included in the time step which successively meets the requirement that the cell diagnosis deviation $D_{diag,i}[k]$ is larger than the diagnosis threshold. When the corresponding time step is multiple, the control circuit 220 may independently accumulate the number of data of each time step.

Figure 4:
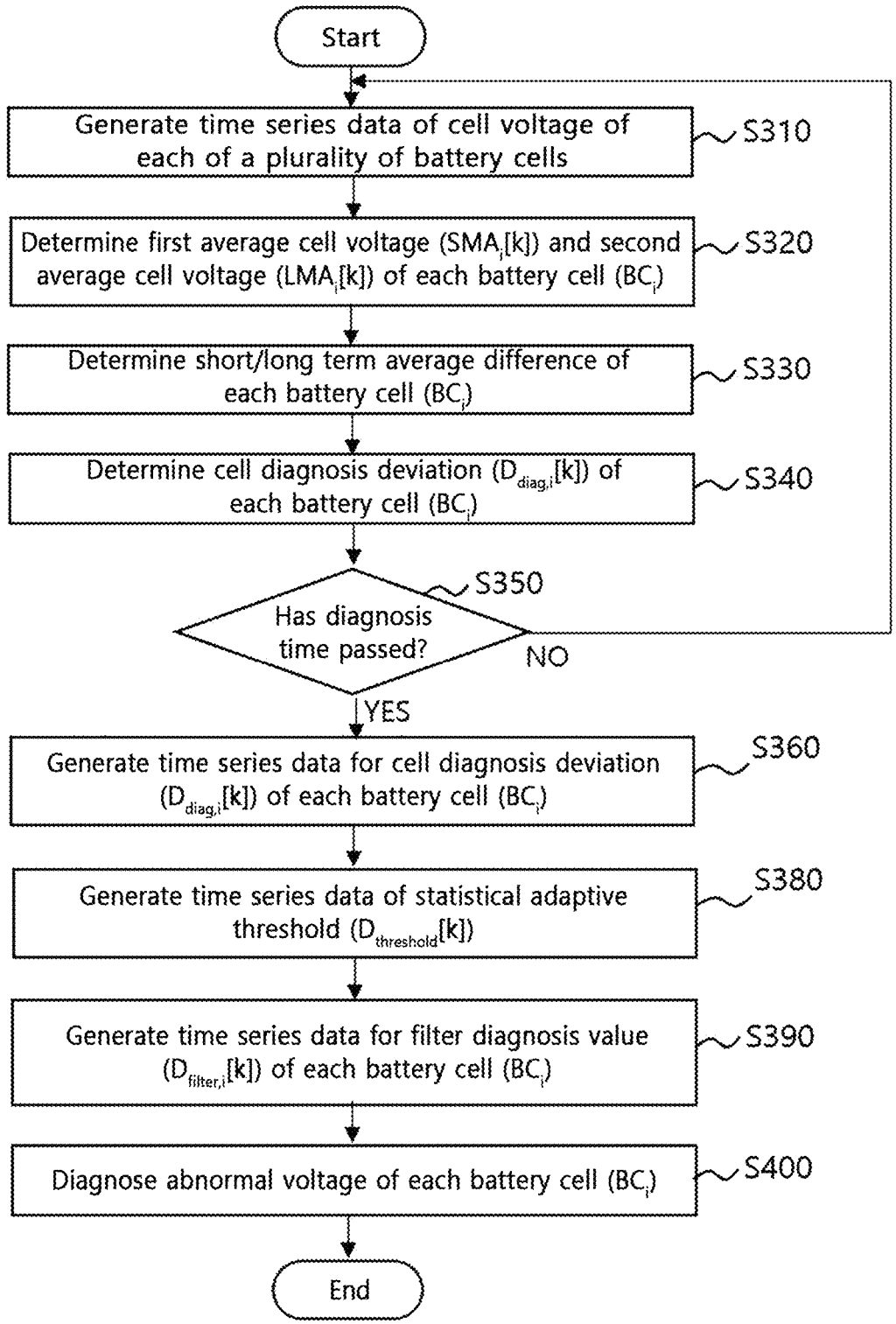
FIG. 4 is a flowchart showing exemplarily a battery diagnosis method according to a second embodiment of the present disclosure.

FIG. 4 is a flowchart showing exemplarily a battery diagnosis method according to a second embodiment of the present disclosure. The method of FIG. 4 may be periodically performed by the control circuit 220 at each unit time.

In the battery diagnose method of the second embodiment, the steps S310 to S360 are, in substance, identical to the first embodiment, and its description is omitted. After the step S360 is completed, step S380 is performed.

In the step S380, the control circuit 220 generates the time series data of the statistical adaptive threshold $D_{threshold}[k]$ using Equation 8. The input of the Sigma function of Equation 8 is time series data for the cell diagnosis deviation $D_{diag,i}[k]$ of all the battery cells generated in the step S360. Preferably, the maximum value of the cell diagnosis deviation $D_{diag,i}[k]$ may be excluded from the input value of the Sigma function. The cell diagnosis deviation $D_{diag,i}[k]$ is a deviation for the short/long term average difference $|SMA_i[k]-LMA_i[k]|$ relative to the average value.

In step S390, the control circuit 220 generates the time series data of the filter diagnosis value $D_{filter,i}[k]$ by filtering the cell diagnosis deviation $D_{diag,i}[k]$ of each battery cell $BC_i$ using Equation 9.

In using Equation 9, $D^*_{diag,i}[k]$ may be replaced with $D_{diag,i}[k]$.

In step S400, the control circuit 220 carries out abnormal voltage diagnosis of each battery cell $BC_i$ by analyzing the time series data of the filter diagnosis value $D_{filter,i}[k]$.

In an example, the control circuit 220 may accumulate time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the accumulation time is larger than the preset reference time as the abnormal voltage cell.

Preferably, the control circuit 220 may accumulate only time step which successively meets the requirement that the filter diagnosis value $D_{filter,i}[k]$ is larger than the diagnosis threshold. When the corresponding time step is multiple, the control circuit 220 may independently calculate the accumulation time at each time step.

In another example, the control circuit 220 may accumulate the number of data included in the time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the data number accumulation value is larger than the preset reference count as the abnormal voltage cell.

Preferably, the control circuit 220 may accumulate only the number of data included in the time step which successively meets the requirement that the filter diagnosis value $D_{filter,i}[k]$ is larger than the diagnosis threshold. When the corresponding time step is multiple, the control circuit 220 may independently accumulate the number of data of each time step.

Figure 5:
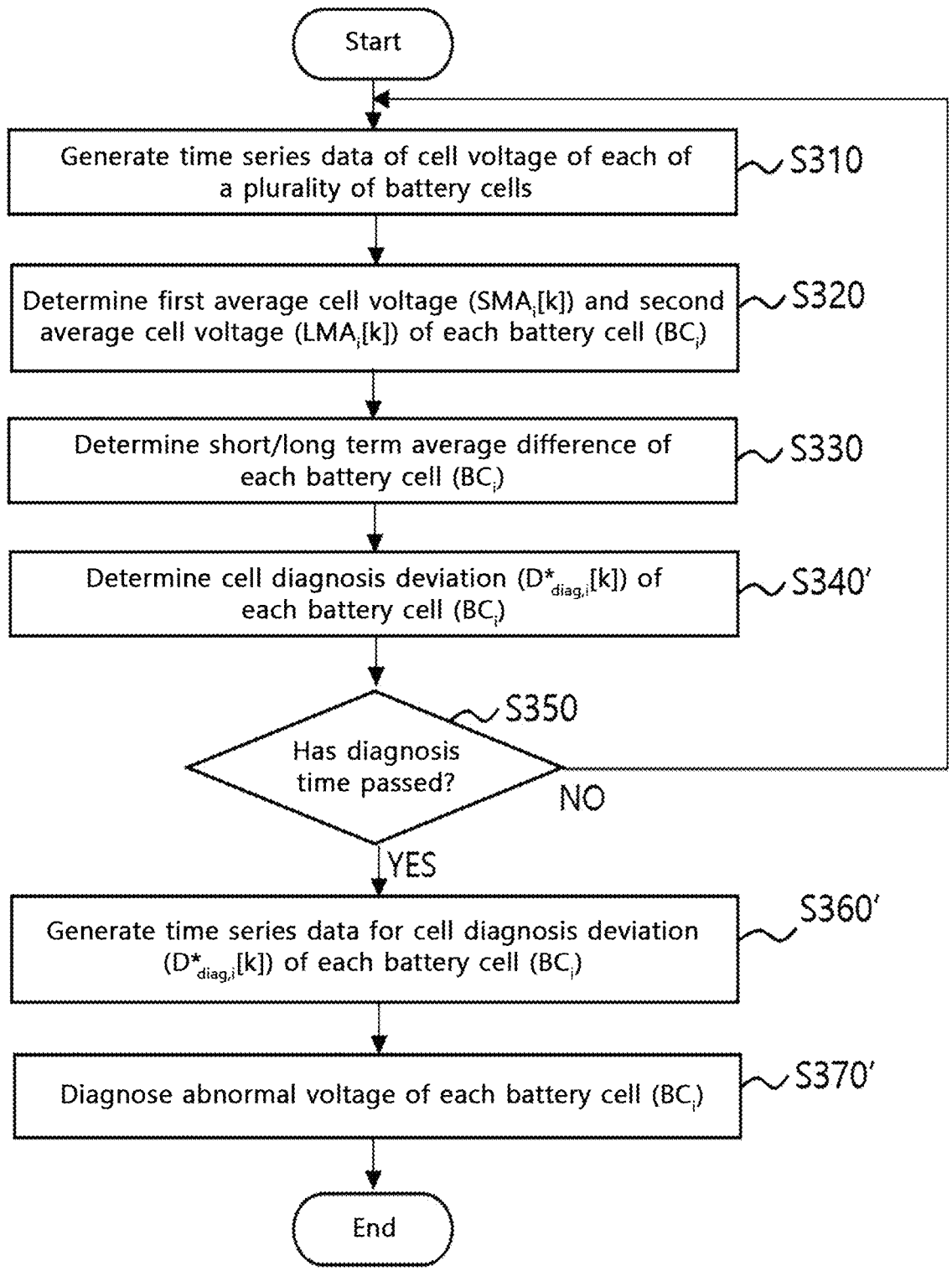
FIG. 5 is a flowchart showing exemplarily a battery diagnosis method according to a third embodiment of the present disclosure.

FIG. 5 is a flowchart showing exemplarily a battery diagnosis method according to a third embodiment of the present disclosure. The method of FIG. 5 may be periodically performed by the control circuit 220 at each unit time.

The battery diagnosis method according to the third embodiment is, in substance, identical to the first embodiment except that the steps S340, S360 and S370 are changed to steps S340', 360' and S370'. Accordingly, the third embodiment will be described with regard to the differences.

In the step S340', the control circuit 220 determines the normalized cell diagnosis deviation $D^*_{diag,i}[k]$ for the short/long term average difference $|SMA_i[k]-LMA_i[k]|$ of each battery cell $BC_i$ using Equation 6. The normalization reference value is an average value of the short/long term average difference $|SMA_i[k]-LMA_i[k]|$. Equation 6 may be replaced with Equation 7.

In the step S360', the control circuit 220 generates the time series data for the normalized cell diagnosis deviation $D^*_{diag,i}[k]$ of each battery cell $BC_i$ collected for the diagnosis time (see FIG. 2d).

In the step S370', the control circuit 220 carries out abnormal voltage diagnosis of each battery cell $BC_i$ by analyzing the time series data for the normalized cell diagnosis deviation $D^*_{diag,i}[k]$.

In an example, the control circuit 220 may accumulate time step in which the cell diagnosis deviation $D^*_{diag,i}[k]$ is larger than the diagnosis threshold (for example, 4) in the time series data for the normalized cell diagnosis deviation $D^*_{diag,i}[k]$ of each battery cell $BC_i$, and diagnose the battery cell which meets the requirement that the accumulation time is larger than the preset reference time as the abnormal voltage cell.

Preferably, the control circuit 220 may accumulate only time step which successively meets the requirement that the normalized cell diagnosis deviation $D^*_{diag,i}[k]$ is larger than the diagnosis threshold. When the corresponding time step is multiple, the control circuit 220 may independently calculate the accumulation time at each time step.

In another example, the control circuit 220 may accumulate the number of data in which the cell diagnosis deviation is larger than the diagnosis threshold (for example, 4) in the time series data for the normalized cell diagnosis deviation $D^*_{diag,i}[k]$ of each battery cell $BC_i$, and diagnose the battery cell which meets the requirement that the data number accumulated value is larger than the preset reference count as the abnormal voltage cell.

Preferably, the control circuit 220 may accumulate only the number of data included in the time step which successively meets the requirement that the normalized cell diagnosis deviation $D^*_{diag,i}[k]$ is larger than the diagnosis threshold. When the corresponding time step is multiple, the control circuit 220 may independently accumulate the number of data of each time step.

Figure 6:
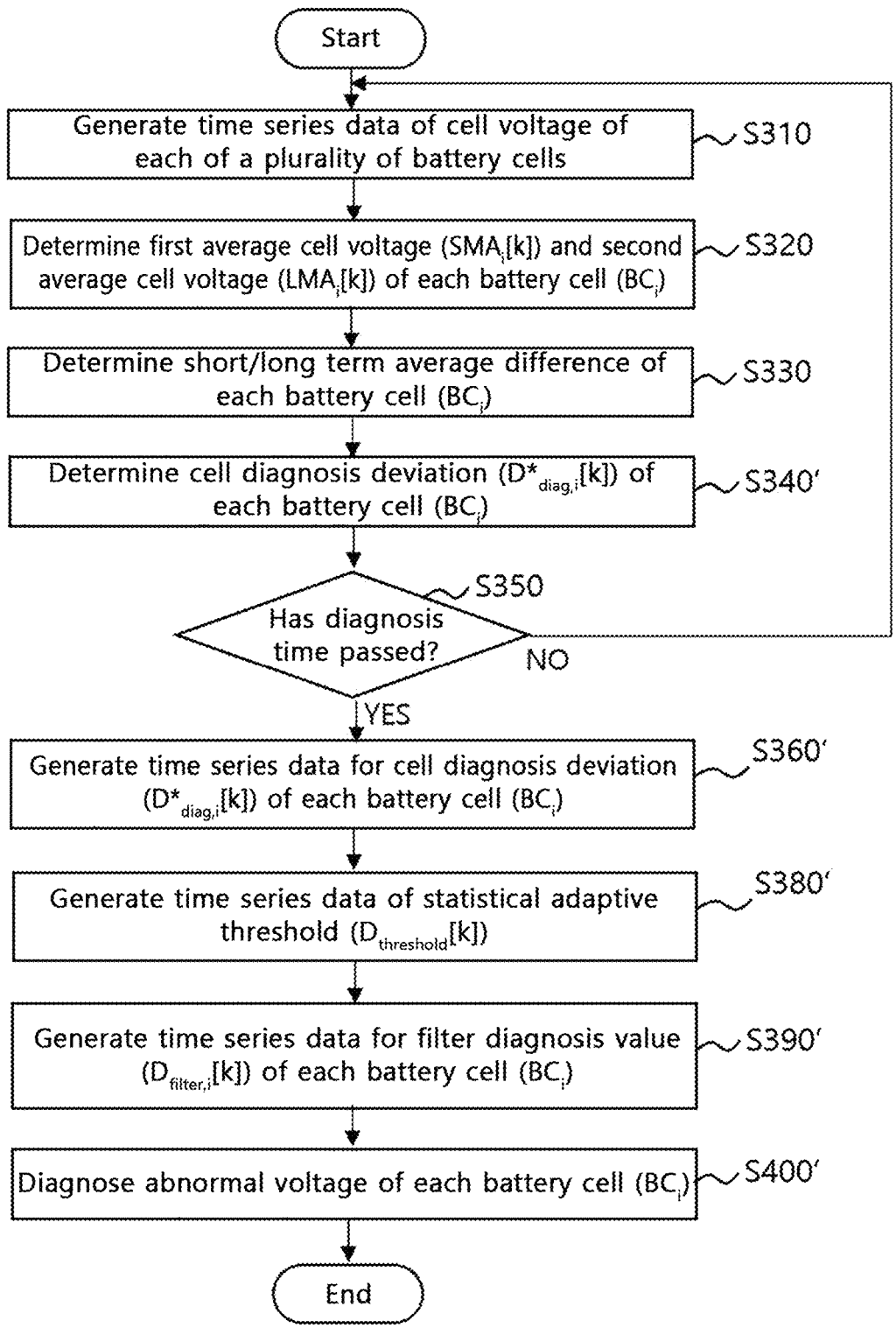
FIG. 6 is a flowchart showing exemplarily a battery diagnosis method according to a fourth embodiment of the present disclosure.

FIG. 6 is a flowchart showing exemplarily a battery diagnosis method according to a fourth embodiment of the present disclosure. The method of FIG. 6 may be periodically performed by the control circuit 220 at each unit time.

The battery diagnosis method according to the fourth embodiment is, in substance, identical to the second embodiment except that the steps S340, S360, S380, S390 and S400 are changed to steps S340', S360', S380', S390' and S400', respectively. Accordingly, the fourth embodiment will be described with regard to the differences from the second embodiment.

In the step S340', the control circuit 220 determines the normalized cell diagnosis deviation $D^*_{diag,i}[k]$ for the short/long term average difference $|SMA_i[k]-LMA_i[k]|$ of each battery cell $BC_i$ using Equation 6. The normalization reference value is an average value of the short/long term average difference $|SMA_i[k]-LMA_i[k]|$. Equation 6 may be replaced with Equation 7.

In the step S360', the control circuit 220 generates the time series data for the normalized cell diagnosis deviation $D^*_{diag,i}[k]$ of each battery cell $BC_i$ collected for the diagnosis time (see FIG. 2d).

In the step S380', the control circuit 220 generates the time series data of the statistical adaptive threshold $D_{threshold}[k]$ using Equation 8. The input of the Sigma function of Equation 8 is time series data for the normalized cell diagnosis deviation $D^*_{diag,i}[k]$ of all the battery cells generated in the step S360'. Preferably, at each time index, the maximum value of the cell diagnosis deviation $D^*_{diag,i}[k]$ may be excluded from the input value of the Sigma function.

In the step S390', the control circuit 220 generates the time series data of the filter diagnosis value $D_{filter,i}[k]$ by filtering the cell diagnosis deviation $D^*_{diag,i}[k]$ of each battery cell $BC_i$ on the basis of the statistical adaptive threshold $D_{threshold}[k]$ using Equation 9.

In the step S400', the control circuit 220 carries out abnormal voltage diagnosis of each battery cell $BC_i$ by analyzing the time series data of the filter diagnosis value $D_{filter,i}[k]$.

In an example, the control circuit 220 may accumulate time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the accumulation time is larger than the preset reference time as the abnormal voltage cell.

Preferably, the control circuit 220 may accumulate time step which successively meets the requirement that the filter diagnosis value $D_{filter,i}[k]$ is larger than the diagnosis threshold. When the corresponding time step is multiple, the control circuit 220 may independently calculate the accumulation time at each time step.

In another example, the control circuit 220 may accumulate the number of data included in the time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the data number accumulated value is larger than the preset reference count as the abnormal voltage cell.

Preferably, the control circuit 220 may accumulate only the number of data included in the time step which successively meets the requirement that the filter diagnosis value $D_{filter,i}[k]$ is larger than the diagnosis threshold. When the corresponding time step is multiple, the control circuit 220 may independently accumulate the number of data of each time step.

Figure 7:
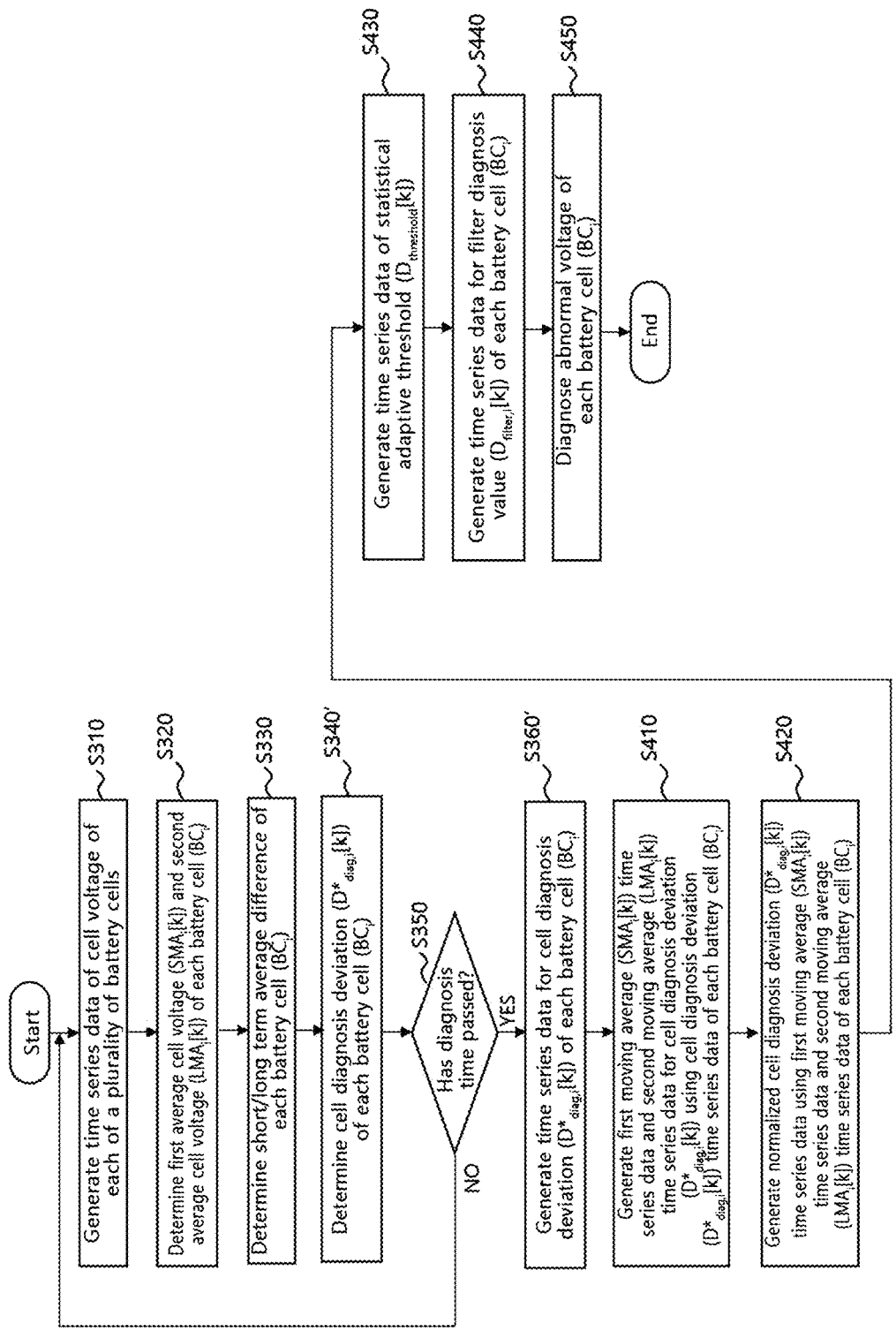
FIG. 7 is a flowchart showing exemplarily a battery diagnosis method according to a fifth embodiment of the present disclosure.

FIG. 7 is a flowchart showing exemplarily a battery diagnosis method according to a fifth embodiment of the present disclosure.

In the fifth embodiment, the steps S310 to S360' are, in substance, identical to the fourth embodiment. Accordingly, the fifth embodiment will be described with regard to differences compared to the fourth embodiment.

In step S410, the control circuit 220 generates the first moving average $SMA_i[k]$ time series data and the second moving average $LMA_i[k]$ time series data for the cell diagnosis deviation $D^*_{diag,i}[k]$ using the normalized cell diagnosis deviation $D^*_{diag,i}[k]$ time series data of each battery cell $BC_i$ (see FIG. 2f).

In step S420, the control circuit 220 generates the normalized cell diagnosis deviation $D^*_{diag,i}[k]$ time series data using the first moving average $SMA_i[k]$ time series data and the second moving average $LMA_i[k]$ time series data of each battery cell $BC_i$ using Equation 6 (see FIG. 2g).

In step S430, the control circuit 220 generates the time series data of the statistical adaptive threshold $D_{threshold}[k]$ using Equation 8 (see FIG. 2g).

In step S440, the control circuit 220 generates the time series data for the filter diagnosis value $D_{filter,i}[k]$ of each battery cell $BC_i$ on the basis of the statistical adaptive threshold $D_{threshold}[k]$ using Equation 9 (see FIG. 2h).

In step S450, the control circuit 220 carries out abnormal voltage diagnosis of each battery cell $BC_i$ by analyzing the time series data of the filter diagnosis value $D_{filter,i}[k]$ of each battery cell $BC_i$.

In an example, the control circuit 220 may accumulate time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the accumulation time is larger than the preset reference time as the abnormal voltage cell.

Preferably, the control circuit 220 may accumulate time step which successively meets the requirement that the filter diagnosis value $D_{filter,i}[k]$ is larger than the diagnosis threshold. When the corresponding time step is multiple, the control circuit 220 may independently calculate the accumulation time at each time step.

In another example, the control circuit 220 may accumulate the number of data included in the time step in which the filter diagnosis value $D_{filter,i}[k]$ is larger than the diagnosis threshold (for example, 0) in the time series data of the filter diagnosis value $D_{filter,i}[k]$ for each battery cell $BC_i$, and diagnose the battery cell which meets the requirement that the data number accumulated value is larger than the preset reference count as the abnormal voltage cell.

Preferably, the control circuit 220 may accumulate only the number of data included in the time step which successively meets the requirement that the filter diagnosis value $D_{filter,i}[k]$ is larger than the diagnosis threshold. When the corresponding time step is multiple, the control circuit 220 may independently accumulate the number of data of each time step.

In the fifth embodiment, the control circuit 220 may recursively perform the steps S410 and S420 at least twice. That is, the control circuit 220 may generate the first moving average $SMA_i[k]$ time series data and the second moving average $LMA_i[k]$ time series data for the cell diagnosis deviation $D^*_{diag,i}[k]$ again in the step S410 using the normalized cell diagnosis deviation $D^*_{diag,i}[k]$ time series data generated in the step S420. Subsequently, the control circuit 220 may generate the normalized cell diagnosis deviation $D^*_{diag,i}[k]$ time series data based on Equation 6 using the first moving average $SMA_i[k]$ time series data and the second moving average $LMA_i[k]$ time series data of each battery cell $BC_i$ again in the step S420. The recursive algorithm may be repeated a preset number of times.

When the steps S410 and S420 are performed according to the recursive algorithm, the steps S430 to S450 may be performed using the cell diagnosis deviation $D^*_{diag,i}[k]$ time series data finally calculated through the recursive algorithm.

In an embodiment of the present disclosure, the control circuit 220 may output diagnosis result information through a display unit (not shown) when abnormal voltage in specific battery cell(s) is diagnosed after abnormal voltage diagnosis for all the battery cells. Additionally, the control circuit 220 may record identification information (ID) of the battery cell in which the abnormal voltage was diagnosed, the time when the abnormal voltage was diagnosed and a diagnosis flag in the memory unit.

Preferably, the diagnosis result information may include a message indicating the presence of a cell in abnormal voltage condition in the cell group. Optionally, the diagnosis result information may include a warning message that it is necessary to precisely inspect the battery cells.

In an example, the display unit may be included in a load device that is supplied with power from the cell group CG. When the load device is an electric vehicle, a hybrid electric vehicle or a plug-in hybrid electric vehicle, the diagnosis result information may be output through a cluster information display. In another example, when the battery diagnosis apparatus 200 according to the present disclosure is included in a diagnosis system, the diagnosis result may be output through a display provided in the diagnosis system.

Preferably, the battery diagnosis apparatus 200 according to an embodiment of the present disclosure may be included in the battery management system 100 or a control system (not shown) of the load device.

According to the above-described embodiments, it is possible to achieve efficient and accurate diagnosis of abnormal voltage of each battery cell by determining two moving averages of cell voltage of each battery cell over two different time lengths at each unit time, and carrying out abnormal voltage diagnosis of each battery cell based on a difference between the two moving averages of each of the plurality of battery cells.

According to another aspect, it is possible to achieve accurate diagnosis of abnormal voltage of each battery cell by applying the advanced techniques such as normalization and/or the statistical adaptive threshold to analyze a difference in variation trend of two moving averages of each battery cell.

According to still another aspect, it is possible to precisely detect the time step in which the abnormal voltage of each battery cell occurred and/or the abnormal voltage detection count by analyzing the time series data of the filter diagnosis value determined based on the statistical adaptive threshold.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery diagnosis apparatus for a cell group including a plurality of battery cells connected in series, the battery diagnosis apparatus comprising:
    a voltage sensing circuit configured to periodically generate a voltage signal indicating a cell voltage of each battery cell of the plurality of battery cells; and
    a control circuit configured to:
        for each battery cell of the plurality of battery cells, generate time series data indicating a change in cell voltage of the battery cell over time based on the voltage signal;
        for each battery cell of the plurality of battery cells, determine a first average cell voltage and a second average cell voltage of the battery cell based on the time series data, wherein the first average cell voltage is a short term moving average, and the second average cell voltage is a long term moving average; and
        detect an abnormal voltage of at least one battery cell based on a difference between the first average cell voltage and the second average cell voltage of the at least one battery cell.

2. The battery diagnosis apparatus according to claim 1, wherein the control circuit is configured to:
    for each battery cell of the plurality of battery cells, determine a short/long term average difference of the battery cell corresponding to the difference between the first average cell voltage and the second average cell voltage of the battery cell;

for each battery cell of the plurality of battery cells, determine a cell diagnosis deviation of the battery cell corresponding to a deviation between an average value of short/long term average differences of all the plurality of battery cells and the short/long term average difference of the battery cell; and in response to the cell diagnosis deviation exceeding a diagnosis threshold for the at least one battery cell, determine that the at least one battery cell is an abnormal voltage cell.

3. The battery diagnosis apparatus according to claim 2, wherein the control circuit is configured to, for each battery cell of the plurality of battery cells, generate time series data of the cell diagnosis deviation of the battery cell, and determine that at least one battery cell of the plurality of battery cells is an abnormal voltage cell either (i) after a period of time during which the cell diagnosis deviation exceeds the diagnosis threshold or (ii) after a number of cell diagnosis deviations exceeding the diagnosis threshold exceeds a predetermined number.

4. The battery diagnosis apparatus according to claim 1, wherein the control circuit is configured to:

for each battery cell of the plurality of battery cells, determine a short/long term average difference of the battery cell corresponding to the difference between the first average cell voltage and the second average cell voltage of the battery cell;

for each battery cell of the plurality of battery cells, determine a cell diagnosis deviation of the battery cell corresponding to a deviation between an average value of short/long term average differences of all the plurality of battery cells and the short/long term average difference of the battery cell;

determine a statistical adaptive threshold based on a standard deviation for the cell diagnosis deviation of all the plurality of battery cells;

for each battery cell of the plurality of battery cells, generate time series data of a filter diagnosis value of the battery cell by filtering time series data for the cell diagnosis deviation of the battery cell based on the statistical adaptive threshold; and detect the abnormal voltage of the at least one battery cell based on a period of time during which the filter diagnosis value of the at least one battery cell exceeds a diagnosis threshold, or based on a number of the filter diagnosis value exceeding the diagnosis threshold.

5. The battery diagnosis apparatus according to claim 1, wherein the control circuit is configured to:

for each battery cell of the plurality of battery cells, determine a short/long term average difference of the battery cell corresponding to the difference between the first average cell voltage and the second average cell voltage of the battery cell, for each battery cell of the plurality of battery cells, determine a normalization value of the short/long term average difference of the battery cell as a normalized cell diagnosis deviation, determine a statistical adaptive threshold based on a standard deviation for the normalized cell diagnosis deviation of all the plurality of battery cells, for each battery cell of the plurality of battery cells, generate time series data of a filter diagnosis value by filtering time series data for the normalized cell diagnosis deviation of the battery cell based on the statistical adaptive threshold, and detect the abnormal voltage of at least one battery cell based on a period of time during which the filter diagnosis value of the at least one battery cell exceeds a diagnosis threshold, or based on a number of the filter diagnosis value exceeding the diagnosis threshold.

6. The battery diagnosis apparatus according to claim 5, wherein the control circuit is configured to, for each battery cell of the plurality of battery cells, normalize the short/long term average difference of the battery cell by dividing the short/long term average difference of the battery cell by an average value of short/long term average differences of all the plurality of battery cells.

7. The battery diagnosis apparatus according to claim 5, wherein the control circuit is configured to, for each battery cell of the plurality of battery cells, normalize the short/long term average difference of the battery cell through log calculation of the short/long term average difference of the battery cell.

8. The battery diagnosis apparatus according to claim 1, wherein the control circuit is configured to, for each battery cell of the plurality of battery cells, generate time series data indicating a change in cell voltage of the battery cell over time using a voltage difference between a cell voltage average value of all the plurality of battery cells and a cell voltage of the battery cell, measured at each unit time.

9. The battery diagnosis apparatus according to claim 1, wherein the control circuit is configured to:

for each battery cell of the plurality of battery cells, determine a short/long term average difference of the battery cell corresponding to the difference between the first average cell voltage and the second average cell voltage of the battery cell;

for each battery cell of the plurality of battery cells, determine a normalization value of the short/long term average difference of the battery cell as a normalized cell diagnosis deviation of the battery cell, and generate time series data of the normalized cell diagnosis deviation of the battery cell;

for each battery cell of the plurality of battery cells, generate the time series data of the normalized cell diagnosis deviation of the battery cell by recursively repeating:

(i) determining a first moving average and a second moving average of the battery cell for the time series data of the normalized cell diagnosis deviation of the battery cell, wherein the first moving average is a short term moving average of the battery cell and the second moving average is a long term moving average of the battery cell, (ii) determining the short/long term average difference of the battery cell corresponding to a difference between the first moving average and the second moving average of the battery cell, (iii) determining the normalization value of the short/long term average difference of the battery cell as the normalized cell diagnosis deviation, and (iv) generating the time series data of the normalized cell diagnosis deviation of the battery cell;

determine a statistical adaptive threshold based on a standard deviation for the normalized cell diagnosis deviation of all the plurality of battery cells;

for each battery cell of the plurality of battery cells, generate time series data of a filter diagnosis value of the battery cell by filtering the time series data for the normalized cell diagnosis deviation of the battery cell based on the statistical adaptive threshold; and detect the abnormal voltage of at least one battery cell based on a period of time during which the filter diagnosis value of the at least one battery cell exceeds a diagnosis threshold, or based on a number of the filter diagnosis value exceeding the diagnosis threshold.

10. A battery pack comprising the battery diagnosis apparatus according to claim 1.

11. A vehicle comprising the battery pack according to claim 10.

12. A battery diagnosis method for a cell group including a plurality of battery cells connected in series, the battery diagnosis method comprising:
   (a) for each battery cell of the plurality of battery cells, periodically generating, by one or more processors, time series data indicating a change in cell voltage of the battery cell over time;
   (b) for each battery cell of the plurality of battery cells, determining, by the one or more processors, a first average cell voltage and a second average cell voltage of the battery cell based on the time series data, wherein the first average cell voltage is a short term moving average, and the second average cell voltage is a long term moving average; and
   (c) detecting, by the one or more processors, an abnormal voltage of at least one battery cell based on a difference between the first average cell voltage and the second average cell voltage of the at least one battery cell.

13. The battery diagnosis method according to claim 12, wherein the step (c) comprises:
   (c1) for each battery cell of the plurality of battery cells, determining, by the one or more processors, a short/long term average difference of the battery cell corresponding to the difference between the first average cell voltage and the second average cell voltage of the battery cell;
   (c2) determining, by the one or more processors, a cell diagnosis deviation of the battery cell corresponding to a deviation between an average value of short/long term average differences of all the plurality of battery cells and the short/long term average difference of the battery cell of the battery cell; and
   (c3) in response to the cell diagnosis deviation exceeding a diagnosis threshold for the at least one battery cell, determining, by the one or more processors, that the at least one battery cell is an abnormal voltage cell.

14. The battery diagnosis method according to claim 13, wherein the step (c) comprises:
   (c1) for each battery cell of the plurality of battery cells, generating, by the one or more processors, time series data of the cell diagnosis deviation of the battery cell, wherein determining that at least one battery cell of the plurality of battery cells is an abnormal voltage cell occurs either after a period of time during which the cell diagnosis deviation exceeds the diagnosis threshold or after a number of cell diagnosis deviations exceeding the diagnosis threshold exceeds a predetermined number.

15. The battery diagnosis method according to claim 12, wherein the step (c) comprises:
   (c1) for each battery cell of the plurality of battery cells, determining, by the one or more processors, a short/long term average difference of the battery cell corresponding to the difference between the first average cell voltage and the second average cell voltage of the battery cell;
   (c2) determining, by the one or more processors, a cell diagnosis deviation of the battery cell corresponding to a deviation between an average value of short/long term average differences of all the plurality of battery cells and the short/long term average difference of the battery cell;
   (c3) determining, by the one or more processors, a statistical adaptive threshold based on a standard deviation for the cell diagnosis deviation of all the plurality of battery cells;
   (c4) for each battery cell of the plurality of battery cells, generating, by the one or more processors, time series data of a filter diagnosis value of the battery cell by filtering time series data for the cell diagnosis deviation of the battery cell based on the statistical adaptive threshold; and
   (c5) detecting, by the one or more processors, the abnormal voltage of the at least one battery cell based on a period of time during which the filter diagnosis value of the at least one battery cell exceeds a diagnosis threshold, or based on a number of the filter diagnosis value exceeding the diagnosis threshold.

16. The battery diagnosis method according to claim 12, wherein the step (c) comprises:
   (c1) for each battery cell of the plurality of battery cells, determining, by the one or more processors, a short/long term average difference of the battery cell corresponding to the difference between the first average cell voltage and the second average cell voltage of the battery cell;
   (c2) for each battery cell of the plurality of battery cells, determining, by the one or more processors, a normalization value of the short/long term average difference of the battery cell as a normalized cell diagnosis deviation;
   (c3) determining, by the one or more processors, a statistical adaptive threshold based on a standard deviation for the normalized cell diagnosis deviation of all the plurality of battery cells;
   (c4) for each battery cell of the plurality of battery cells, generating, by the one or more processors, time series data of a filter diagnosis value by filtering time series data for the normalized cell diagnosis deviation of the battery cell based on the statistical adaptive threshold; and
   (c5) detecting, by the one or more processors, the abnormal voltage of the at least one battery cell based on a period of time during which the filter diagnosis value of the at least one battery cell exceeds a diagnosis threshold, or based on a number of data of the filter diagnosis value exceeding the diagnosis threshold.

17. The battery diagnosis method according to claim 16, wherein the step (c2) comprises for each battery cell of the plurality of battery cells, normalizing, by the one or more processors, the short/long term average difference of the battery cell by dividing the short/long term average difference of the battery cell by an average value of short/long term average differences of all the plurality of battery cells.

18. The battery diagnosis method according to claim 16, wherein the step (c2) comprises, for each battery cell of the plurality of battery cells, normalizing, by the one or more processors, the short/long term average difference of the battery cell through log calculation of the short/long term average difference of the battery cell.

19. The battery diagnosis method according to claim 12, wherein the step (a) comprises, for each battery cell of the plurality of battery cells, generating, by the one or more processors, time series data indicating a change in cell voltage of the battery cell over time using a voltage difference between a cell voltage average value of all the plurality of battery cells and a cell voltage of the battery cell, measured at each unit time.

20. The battery diagnosis method according to claim 12, wherein the step (c) comprises:
   (c1) for each battery cell of the plurality of battery cells, determining, by the one or more processors, a short/long term average difference of the battery cell corresponding to the difference between the first average cell voltage and the second average cell voltage of the battery cell;
   (c2) for each battery cell of the plurality of battery cells, determining, by the one or more processors, a normalization value of the short/long term average difference of the battery as a normalized cell diagnosis deviation of the battery cell;
   (c3) for each battery cell of the plurality of battery cells, generating, by the one or more processors, time series data of the normalized cell diagnosis deviation of the battery cell;
   (c4) for each battery cell of the plurality of battery cells, generating, by the one or more processors, the time series data of the normalized cell diagnosis deviation for each battery cell by recursively repeating:
      (i) determining, by the one or more processors, a first moving average and a second moving average of the battery cell for the time series data of the normalized cell diagnosis deviation of the battery cell, wherein the first moving average is a short term moving average of the battery cell and the second moving average is a long term moving average of the battery cell, (ii) determining the short/long term average difference of the battery cell corresponding to a difference between the first moving average and the second moving average of the battery cell, (iii) determining the normalization value of the short/long term average difference of the battery cell as the normalized cell diagnosis deviation, and (iv) generating the time series data of the normalized cell diagnosis deviation of the battery cell,
   (c5) determining, by the one or more processors, a statistical adaptive threshold based on a standard deviation for the normalized cell diagnosis deviation of all the plurality battery cells;
   (c6) for each battery cell of the plurality of battery cells, generating, by the one or more processors, time series data of a filter diagnosis value of the battery cell by filtering the time series data for the normalized cell diagnosis deviation of the battery cell based on the statistical adaptive threshold; and
   (c7) detecting, by the one or more processors, the abnormal voltage of at least one battery cell based on a period of time during which the filter diagnosis value of the at least one battery cell exceeds a diagnosis threshold, or based on a number of the filter diagnosis value exceeding the diagnosis threshold.

* * * * *